United States Patent
Hong et al.

(10) Patent No.: US 10,162,311 B2
(45) Date of Patent: Dec. 25, 2018

(54) DISPLAY PANEL WITH MINIMUM BORDERS

(71) Applicant: QUALCOMM Incorporated, San Diego, CA (US)

(72) Inventors: John Hong, San Clemente, CA (US); Jan Bos, Hsinchu (TW); Yi-Nan Chu, Zhongli (TW); Cheonhong Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 98 days.

(21) Appl. No.: 15/154,774

(22) Filed: May 13, 2016

(65) Prior Publication Data

US 2017/0168463 A1    Jun. 15, 2017

Related U.S. Application Data

(60) Provisional application No. 62/267,726, filed on Dec. 15, 2015.

(51) Int. Cl.
*G04G 17/04* (2006.01)
*G04G 9/00* (2006.01)
(Continued)

(52) U.S. Cl.
CPC ......... *G04G 17/045* (2013.01); *G02F 1/1345* (2013.01); *G04G 9/0064* (2013.01);
(Continued)

(58) Field of Classification Search
CPC ........ G04G 17/045; G04G 17/06; G04G 9/10; G04G 9/0064; G04G 9/12; H05K 1/148; G02F 1/1345; G02F 2201/56
See application file for complete search history.

(56) References Cited

U.S. PATENT DOCUMENTS 8,716,932 B2   5/2014   Rappoport et al.
9,209,207 B2  12/2015   Park et al.
(Continued)

FOREIGN PATENT DOCUMENTS

EP          2733598 A2    5/2014
WO    WO-2016143656 A1   9/2016
(Continued)

OTHER PUBLICATIONS

International Search Report and Written Opinion—PCT/US2016/066217—ISA/EPO—dated Oct. 12, 2017.

*Primary Examiner* — Michael Caley
*Assistant Examiner* — Mariam Qureshi
(74) *Attorney, Agent, or Firm* — Loza & Loza, LLP/Qualcomm

(57) ABSTRACT

A device includes a substrate with a curvilinear perimeter segment adjoined to a plurality of facets, a display area, a border area surrounding the display area, and connection pads, divided into groups corresponding to the facets, in the border area. A flexible circuit board with arms coupled to the groups of connection pads is included. Another device includes a substrate having a display area, first connection pads within a border area peripheral to the display area, and a flexible circuit board having a first portion including second connection pads configured to be coupled to the first connection pads, and a second portion configured to accommodate a plurality of transmission lines extending from the second connection pads. An arc length of the first portion can be greater than that of the second portion and a center-to-center pitch of the second connection pads can be greater than that of the transmission lines.

29 Claims, 13 Drawing Sheets

(51) Int. Cl.
  *G04G 9/10* (2006.01)
  *G04G 9/12* (2006.01)
  *G02F 1/1345* (2006.01)
  *H05K 1/14* (2006.01)
  *G04G 17/06* (2006.01)

(52) U.S. Cl.
  CPC .................. *G04G 9/10* (2013.01); *G04G 9/12* (2013.01); *G04G 17/06* (2013.01); *H05K 1/148* (2013.01); *G02F 2201/56* (2013.01); *H05K 2201/052* (2013.01); *H05K 2201/053* (2013.01); *H05K 2201/056* (2013.01); *H05K 2201/10128* (2013.01)

(56) References Cited

U.S. PATENT DOCUMENTS

| | | |
|---|---|---|
| 2008/0224990 A1 | 9/2008 | Shimodaira |
| 2013/0088671 A1 | 4/2013 | Drzaic et al. |
| 2014/0139637 A1* | 5/2014 | Mistry ................. H04N 5/2252 348/46 |
| 2015/0208522 A1 | 7/2015 | Kim et al. |
| 2015/0340795 A1 | 11/2015 | Lee et al. |
| 2016/0291745 A1* | 10/2016 | Grip ........................ G04G 21/08 |
| 2016/0313593 A1* | 10/2016 | Grip .................... G02F 1/13452 |

FOREIGN PATENT DOCUMENTS

| | | |
|---|---|---|
| WO | WO-2016143659 A1 | 9/2016 |
| WO | WO-2017043429 A1 | 3/2017 |

* cited by examiner

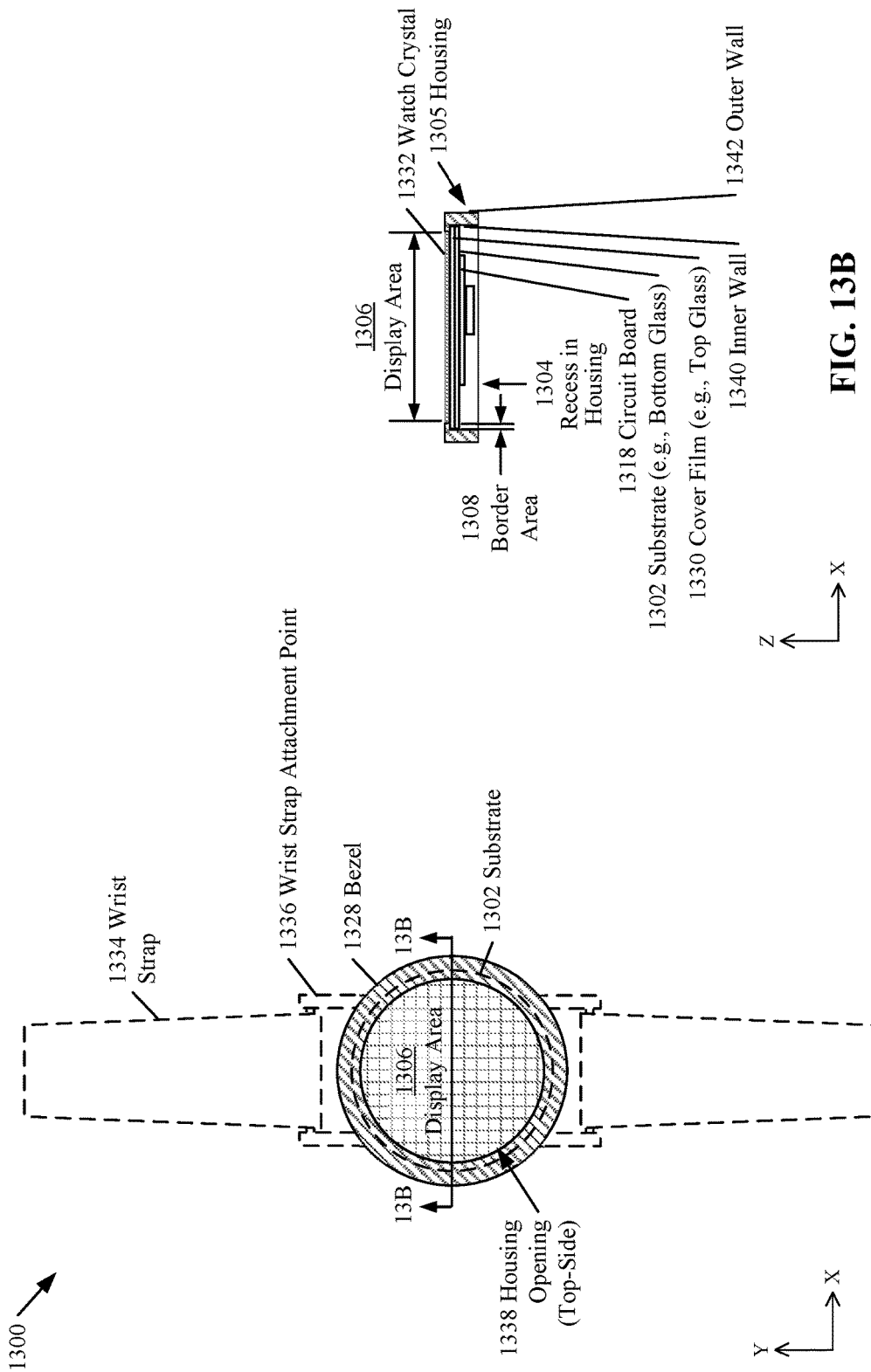

DISPLAY PANEL WITH MINIMUM BORDERS

This application claims priority to U.S. Provisional Application No. 62/267,726 filed Dec. 15, 2015, titled Display Panel With Minimum Borders, the contents of which are incorporated by reference herein.

FIELD OF THE DISCLOSURE

Various features relate wearable displays, and more specifically to wristwatch-like wearable devices including display panels with minimum borders.

BACKGROUND

Wristwatch-like wearable devices are often referred to as smartwatches. Smartwatches play a dual role of stylish fashion accessory and functional device. Manufacturers of smartwatches desire a particular shape of an outside of a watch housing and a shape of a display area (e.g., a portion of a display panel that includes active pixels) of the display panel contained within the watch housing. Round may be perceived as being the most elegant and/or sophisticated of the shapes. The perceived elegance and sophistication of a round display area within a round housing are enhanced by a narrow bezel surrounding the display area of the smartwatch.

It is desirable to provide bezels that are as narrow as possible and display areas that are as large as possible. A narrow bezel maximizes the display area and imparts a positive visual impression. Because the bezel may conceal the border area adjacent to an outer edge of the display area, the border area should also be as narrow as possible. However, transmission lines (e.g., control lines, display driver lines, power lines, and/or ground lines) in the border area couple circuitry in the display area and border area to connection pads. The connection pads may be arranged in a linear row to facilitate connection to a flexible circuit board. The configuration of the connection pads is not a design choice; the configuration of the connection pads is a technical problem that is forced upon persons of skill in the art by, for example, the stylish shapes of smartwatches selected by manufacturers and designers of smartwatches. Configuring the connection pads, to minimize border areas and maximize display areas for round and non-round display panels presents persons of skill in the art with a real world problem.

SUMMARY

According to one aspect, a display panel with minimum borders may include a device having a substrate, including: a perimeter including a curvilinear segment adjoined to a plurality of facets, each adjacent pair of the plurality of facets adjoined at an obtuse angle, a display area, including pixels on a surface of the substrate, a border area surrounding the display area, and a plurality of first connection pads, in the border area, coupled to the pixels, and divided into groups of first connection pads, each of the groups of first connection pads adjacent to a corresponding one of the plurality of facets. The device may further include a flexible circuit board having a plurality of arms corresponding to the plurality of facets, each of the plurality of arms coupled to a corresponding one of the groups of first connection pads.

In an implementation, the curvilinear segment can be semicircular. The display area can be round. The border area can be annular.

According to an aspect, the border area can have a width and, for a given diameter substrate and a given quantity of first connection pads, the width of the border area can be reduced by adding facets to the plurality of facets to reduce a number of first connection pads in each of the groups of first connection pads.

In an implementation, the device can further include a display driver operationally coupled to the flexible circuit board, wherein the groups of first connection pads adjacent to the plurality of facets are coupled to the display driver via the plurality of arms of the flexible circuit board. In an implementation, the flexible circuit board includes only one display driver.

In an implementation, each arm of the plurality of arms may include only one fold that is parallel to an edge of a corresponding facet, to facilitate wrapping each arm around the perimeter of the substrate and positioning the flexible circuit board adjacent to a backside of the substrate before a plurality of second connection pads of each arm are coupled to corresponding first connection pads of the substrate.

In another implementation, an arm of the plurality of arms may include one fold that is parallel to an edge of a corresponding facet and a plurality of non-parallel folds, to facilitate wrapping the arm around the perimeter of the substrate and positioning the flexible circuit board adjacent to a backside of the substrate after a plurality of second connection pads of each arm of the plurality of arms are coupled to corresponding first connection pads on the substrate.

In an aspect, the device can be incorporated into an electronic device selected from a group including at least one of a wearable device and a wristwatch-like wearable device.

According to an aspect, a device can include a substrate, including: a perimeter including a curvilinear segment adjoined to a plurality of facets, each adjacent pair of the plurality of facets adjoined at an obtuse angle, a display area, including pixels on a surface of the substrate, a border area surrounding the display area, and a plurality of first connection pads, in the border area, coupled to the pixels, and divided into groups of first connection pads, each of the groups of first connection pads adjacent to a corresponding one of the plurality of facets; and means for coupling to the plurality of first connection pads.

In an implementation, the means for coupling to the plurality of first connection pads can include a flexible circuit board having a plurality of arms corresponding to the plurality of facets, each of the plurality of arms coupled to a corresponding one of the groups of first connection pads.

In an aspect, each arm of the plurality of arms may include only one fold that is parallel to an edge of a corresponding facet, to facilitate wrapping each arm around the perimeter of the substrate and positioning the flexible circuit board adjacent to a backside of the substrate before a plurality of second connection pads of each arm are coupled to corresponding first connection pads of the substrate. In another aspect, an arm of the plurality of arms may include one fold that is parallel to an edge of a corresponding facet and a plurality of non-parallel folds, to facilitate wrapping the arm around the perimeter of the substrate and positioning the flexible circuit board adjacent to a backside of the substrate after a plurality of second connection pads of each arm of the plurality of arms are coupled to corresponding first connection pads on the substrate.

In one implementation, a device may include a substrate, including: a first surface, an opposite second surface, and an edge at a perimeter of the substrate, wherein the edge includes a curvilinear segment adjoined to N facets, adjacent pairs of the N facets adjoined at an obtuse angle, wherein N can be greater than or equal to two, a plurality of pixels within a display area of the substrate, N groups of connection pads, coupled to the plurality of pixels, within a border area peripheral to the display area, each of the N groups of connection pads adjacent to a corresponding one of the N facets. The device may further include a flexible circuit board configured with N arms, wherein each of the N arms can be coupled to a corresponding one of the N groups of connection pads. In an aspect, the curvilinear segment can be semicircular. The display area can be round. The border area can be annular.

According to an aspect, the border area can have a width and, for a first diameter substrate, the width of the border area can be reduced by increasing a value of N.

In an implementation, the device may further include a display driver, wherein each of the N groups of connection pads can be coupled to the display driver via the N arms of the flexible circuit board.

In one aspect, each of the N arms may include only one fold, parallel to an edge of a corresponding facet, to facilitate wrapping the N arms around the edge of the substrate and positioning the flexible circuit board adjacent to a backside of the substrate, before the N arms are coupled to the N groups of connection pads.

In another aspect, each of the N arms may include one fold parallel to an edge of a corresponding facet and a plurality of non-parallel folds, to facilitate wrapping the N arms around the edge of the substrate and positioning the flexible circuit board adjacent to a backside of the substrate after the N arms are coupled to the N groups of connection pads.

According to another aspect, a device may include a substrate having an outer perimeter; a plurality of pixels on a first side of the substrate, within a display area; a plurality of first connection pads on the first side of the substrate, within an annular border area peripheral to the display area and adjacent to the outer perimeter, the plurality of pixels coupled to the plurality of first connection pads. The device may further include a flexible circuit board including: a first portion including a plurality of second connection pads configured to be coupled to corresponding ones of the plurality of first connection pads, the first portion may a shape that corresponds to a segment of the annular border area, and a second portion may be configured to accommodate a plurality of transmission lines extending from the second connection pads, wherein the plurality of transmission lines can be routed on and/or in the first portion to the second portion and occupy an area on and/or within the second portion, wherein an arc length of the first portion can be greater than an arc length of the second portion, and a center-to-center pitch of the plurality of second connection pads in the first portion can be greater than a center-to-center pitch of the plurality of transmission lines in the area on and/or within the second portion.

In one implementation, the outer perimeter can be round. In another implementation, the outer perimeter can include a curvilinear segment adjoined to a facet, and the second portion can be configured to wrap around an edge of the substrate adjacent to the facet. In an aspect, the display area can be round. In an implementation, an edge of the first portion, which is proximal to an edge of the display area, can extend to the edge of the display area. In an implementation, an edge of the first portion, which is proximal to an edge of the display area, can extend into a flit border of the substrate.

DRAWINGS

Various features, nature, and advantages may become apparent from the detailed description set forth below when taken in conjunction with the drawings in which like reference characters identify correspondingly throughout.

FIG. 13A illustrates a topside plan view of one implementation of an electronic device that may include any of the substrates of FIGS. 3-12 described herein.

FIG. 13B illustrates a cross-section view taken along the line 13B-13B in FIG. 13A.

DETAILED DESCRIPTION

Figure 1:
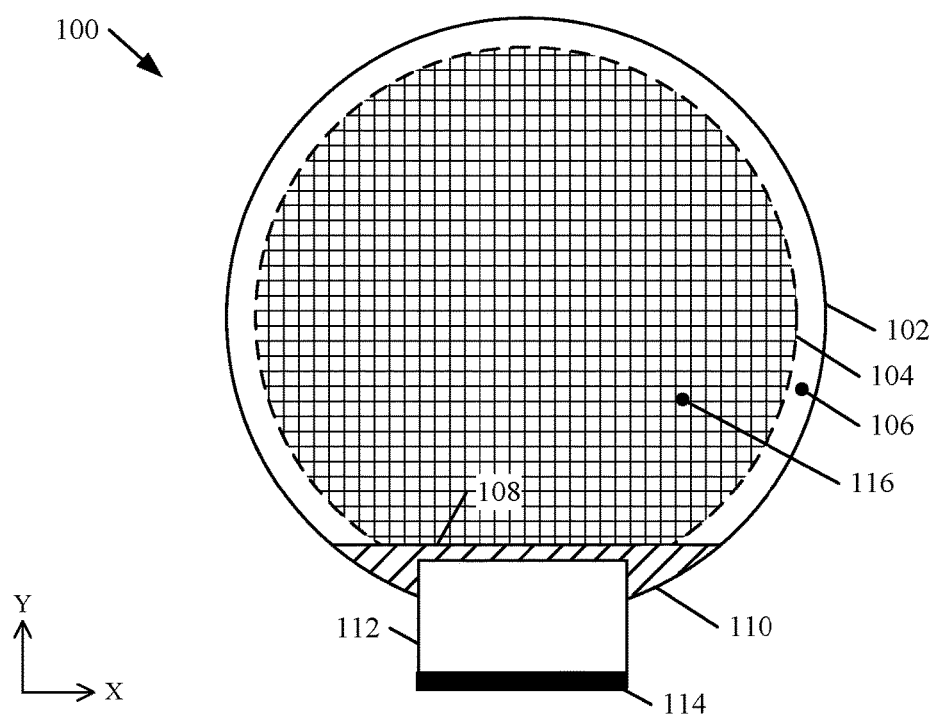
FIG. 1 illustrates a plan view of a "flat tire" configuration of a display panel, according to the prior art.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures, and techniques may not be shown in detail in order not to obscure the aspects of the disclosure.

As used herein, the term "bezel" may be used to refer to a rim that surrounds a transparent covering (e.g., watch crystal) of a housing (e.g., a smartwatch housing). The bezel may hold, or appear to hold, the transparent covering onto the housing. The bezel may conceal at least some of a border area adjacent to an outer edge of a display area of a display panel.

As used herein, the term "substrate" may be used to refer to a glass or plastic piece of a display panel.

As used herein, the term "round" may mean shaped like or approximately like a circle, disk, or cylinder. The terms "round" and "circular" may be used interchangeably. The term "non-round" may mean shaped like or approximately like a closed plane figure bordered by linear and/or curvilinear segments. The term "curvilinear" may mean consisting of or bounded by curved lines.

As used herein, the term "display area" may mean a portion of a display panel that includes active pixels. The display area may be a part of a display panel that is visible to a user when the display panel is enclosed within a housing (e.g., a smartwatch housing).

As used herein, the term "above" may mean occupying a space over something. Use of the term "above" may contemplate a presence of one or more intermediate elements occupying the space between a referenced element and an item described as being "above" the referenced element.

In some implementations, a height of a substrate may be defined along a Z-direction of the substrate, which is shown in the figures of the present disclosure. In some implementations, the Z-direction of the substrate may be defined along an axis between a topside surface (also referred to herein as a front-side surface) and a backside surface (also referred to herein as a bottom-side or back-side surface) of the substrate. The terms topside (or top) and backside (or bottom) may be arbitrarily assigned; however as an example, a topside surface of a substrate may be a portion comprising a majority of the input/output connection pads and a display area, while a backside surface of the substrate may be a portion opposite to the backside. A topside portion may be a higher portion relative to a lower backside portion. A backside portion may be a lower portion relative to a higher portion. Further examples of topside portions and backside portions will be further described below. The X-Y directions of the substrate may refer to the lateral direction and/or footprint of the substrate. Examples of X-Y directions are shown in the figures of the present disclosure and/or further described below.

One class of wearable devices includes wristwatch-like devices. Wristwatch-like wearable devices may strap onto a user's wrist in the same way as a traditional wristwatch. The wearable devices may include high-resolution video displays with brilliant colors. The wearable devices may include processing circuits that are able to execute a multitude of applications.

Overview

Some features pertain to a substrate of a display panel of an electronic device (e.g., a smartwatch) having a perimeter with a plurality of adjacent facets. The substrate includes a display area including active pixels. The substrate also includes a border area, peripheral to the display area. The border area includes connection pads that are coupled to the active pixels. Each of the plurality of adjacent facets provides an edge (e.g., a straight edge) adjacent to which a group of connection pads can be formed. The groups of connection pads can be distributed among the plurality of adjacent facets. In one aspect, each group of connection pads formed adjacent to each facet can be coupled to a corresponding group of connection pads of an arm of a multiple-arm flexible circuit board (e.g., a flexible substrate circuit board, flexible ribbon circuit board, flexible film circuit board). One arm per facet can extend from the multiple-arm flexible circuit board. The arms can wrap around the substrate. According to aspects of the disclosure, for a first diameter substrate and a first number of connection pads, a width of the border area may be decreased by increasing a quantity of facets and correspondingly decreasing a number of connection pads in each group of connection pads.

Prior Art Display Panels

FIG. 1 illustrates a plan view of a "flat tire" configuration of a display panel 100, according to the prior art. The display panel 100 includes a substrate 102 (e.g., bottom glass). The substrate 102 includes a display area 104. The display area 104 does not have a round shape. A part of the substrate 102 that could be used to form a round display area is lost to provide a flat tire area 110. In the flat tire configuration, a line 108 can be effectively drawn across a bottom portion of the display area 104, where the line 108 extends from the left outer edge of the substrate 102 to the right outer edge of the substrate 102. The flat tire area 110 may be defined by the cut-off (e.g., truncated) circular area below the line 108. The flat tire area 110 includes connection pads of the substrate 102 coupled to pixels of the display area 104 via transmission lines. The transmission lines may be routed to the connection pads in the flat tire area 110. The connection pads of the substrate 102 may be bonded to corresponding connection pads of a flexible circuit board in the flat tire area 110. A border area 106 can be defined between an outer edge of the display area 104 and a portion of an outer edge of the substrate 102; however, the border area 106 is distinct from the flat tire area 110. Connection pads are not located in the border area 106 of the exemplary "flat tire" configuration of FIG. 1.

The dimensions of the flat tire area 110 may depend, for example, on the number of connection pads and transmission lines 116 located in the flat tire area 110, the width of the transmission lines 116, and the minimum spacing between the transmission lines 116, etc. For a substrate 102 with a given diameter, as the number of transmission lines increases (assuming the width and spacing of the transmission lines remains constant), the space occupied by the flat tire area 110 can increase; the flat tire area 110 will therefore impinge further into the display area 104 as the number of transmission lines and/or connection pads increases. Therefore, a substrate 102 configured with a flat tire area 110 may not be compatible with a round (e.g., circular) display area.

The flexible circuit board 112 may be wrapped under the outer edge of the substrate 102. The flexible circuit board 112 may couple to a printed circuit board (not shown) adjacent to the backside of the substrate 102 via a connector 114. The flexible circuit board 112 of FIG. 1 may be employed to transfer signals present on the plurality of connection pads within the flat tire area 110 to the connector 114.

When the display panel 100 is inserted into a housing (not shown) having a round opening, the flat tire area 110 and the display area 104 adjacent to the flat tire area 110 (e.g., the truncated area) may both lie in the round opening. Without additional covering, both are visible to a user.

An opaque (e.g., non-light transmissive) layer may be used hide the flat tire area 110, and any portion of the flexible circuit board 112 not wrapped under the outer edge of the substrate 102, from a user. The use of the opaque layer to hide the flat tire area 110, and any exposed portion of the flexible circuit board 112, leads to a visual effect giving an appearance that the bottom of the display area 104 has disappeared or been hidden from view. This visual effect can be reminiscent of the appearance of a flat tire on an automobile. Hence, this type of display can be referred to as a flat tire display. The flat tire display has issues of at least distortion (e.g., caused by truncation of the display area 104) of an aesthetically pleasing round shape of the display area 104 and an inability to minimize the border area 106 of the substrate 102.

Figure 2:
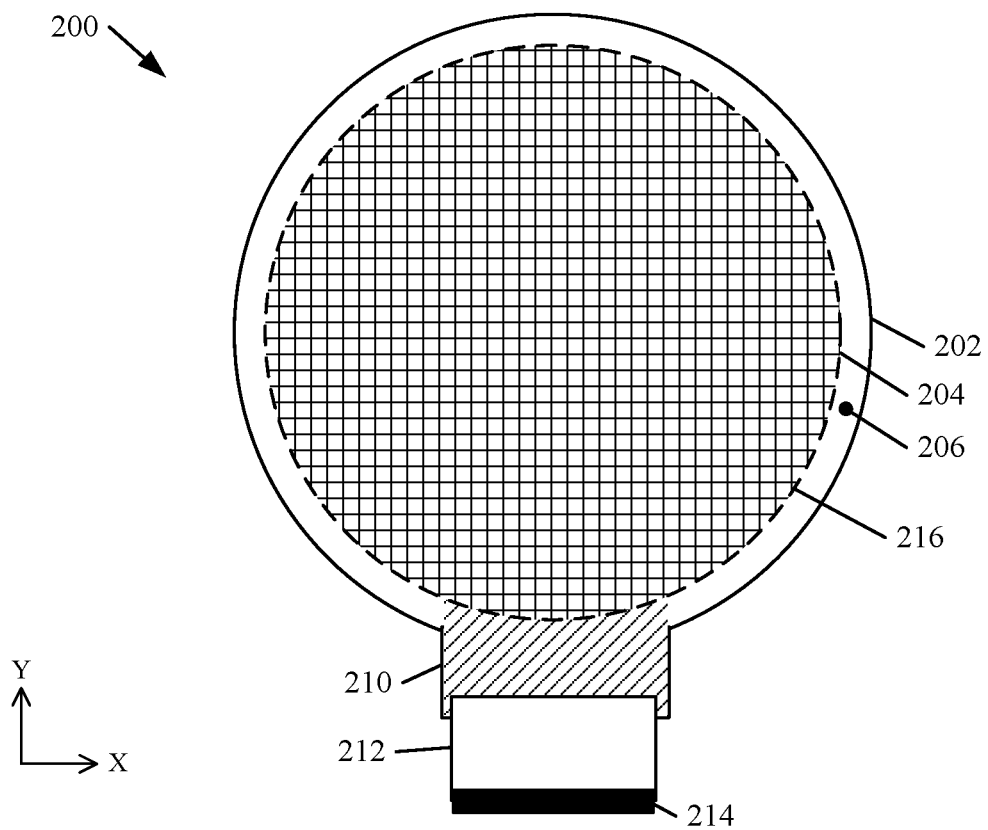
FIG. 2 illustrates a plan view of a "tab" configuration of a display panel, according to the prior art.

FIG. 2 illustrates a plan view of a "tab" configuration of a display panel 200, according to the prior art. The tab configuration may be found in smartwatches having a housing with an elongated portion formed to accommodate a tab structure 210. The tab structure 210 may extend from and may be integral to the substrate 202. In some implementations, the elongated portion of the housing is not desirable.

In the "tab" configuration of the display panel 200, transmission lines 216 coupled between pixels in a display area 204 may be routed in and/or on the tab structure 210 to connection pads located at a distal end of the tab structure 210. In the example of FIG. 2, the connection pads may be positioned along an edge of the tab structure 210 that is distal to the center of the display panel 200. The connection pads can therefore occupy the same width as the width of the tab structure 210. Additionally, a flexible circuit board 212, which may be coupled to the connection pads, can also occupy the same width as the width of the tab structure 210. In such a configuration, the transmission lines of the tab structure and their associated connection pads at the distal end of the tab structure 210 can have the same center-to-center pitch. Furthermore, in such a configuration, the transmission lines in the flexible circuit board 212 and their associated connection pads coupled to the connection pads at the end of the tab structure 210, can have the same center-to-center pitch.

The display panel 200 includes a substrate 202 (e.g., bottom glass). A display area 204 can be defined for the substrate 202. A border area 206 can be defined between an outer edge of the display area 204 and portion of an outer edge of the substrate 202; however, the border area 206 is distinct from the tab structure 210. Connection pads are not located in the border area 206 of the exemplary "tab" configuration of FIG. 2.

The dimensions of the tab structure 210 may be dependent on the width of the transmission lines 216, as well as the number of transmission lines 216.

A flexible circuit board 212 may be coupled (e.g., bonded) to the plurality of connection pads within the tab structure 210.

The flexible circuit board 212 may be wrapped under the outer edge of the tab structure 210 substrate 202. The flexible circuit board 212 may couple to a printed circuit board adjacent to the backside of the substrate 202 via a connector 214. Notably, the routing of the transmission lines 216 to a plurality of connection pads occurs at the tab structure 210. The flexible circuit board 212 of FIG. 2 may be configured to transfer the signals present on the plurality of connection pads at the tab structure 210 to the connector 214.

The "tab configuration" of a display panel 200 has issues of at least extra width added by a protrusion or extension of at least one region of a housing that holds the display panel 200, to accommodate the tab structure 210 in the housing that holds the display panel 200.

Exemplary Display Panels with Faceted Edges

Implementations described herein may distribute connections across a plurality of connection areas within a border area of a substrate. As the number of connection areas increase, the number of connection pads in each connection area may decrease. One consequence of handling fewer connection pads in each connection area may be that fewer transmission lines are coupled to each connection area. Fewer transmission lines may allow for more compact routing of transmission lines (e.g., less fan-out) in the border area and consequently, the border are can be narrowed.

The configuration of connection pads and/or the use and configuration of the flexible circuit boards described herein is not a design choice; rather, the configurations are a technical problem that can be forced upon persons of skill in the art by, for example, the shapes of smartwatches selected by manufacturers and designers of smartwatches. Configuring the connection pads, to minimize a border area and maximize a display area, and the configuration of the flexible circuit boards described herein for round and substantially round display panels presents persons of skill in the art with a real world problem, which may be solved by aspects described herein.

Figure 3A:
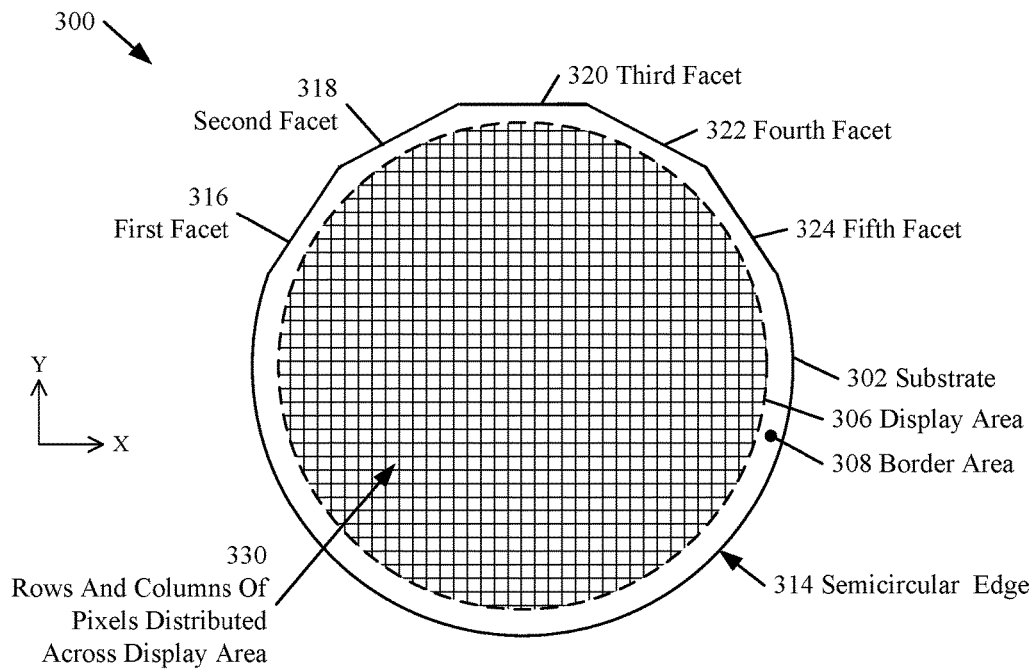
FIG. 3A illustrates a plan view of a display panel with a minimum width border area, according to an aspect described herein.
Figure 3B:
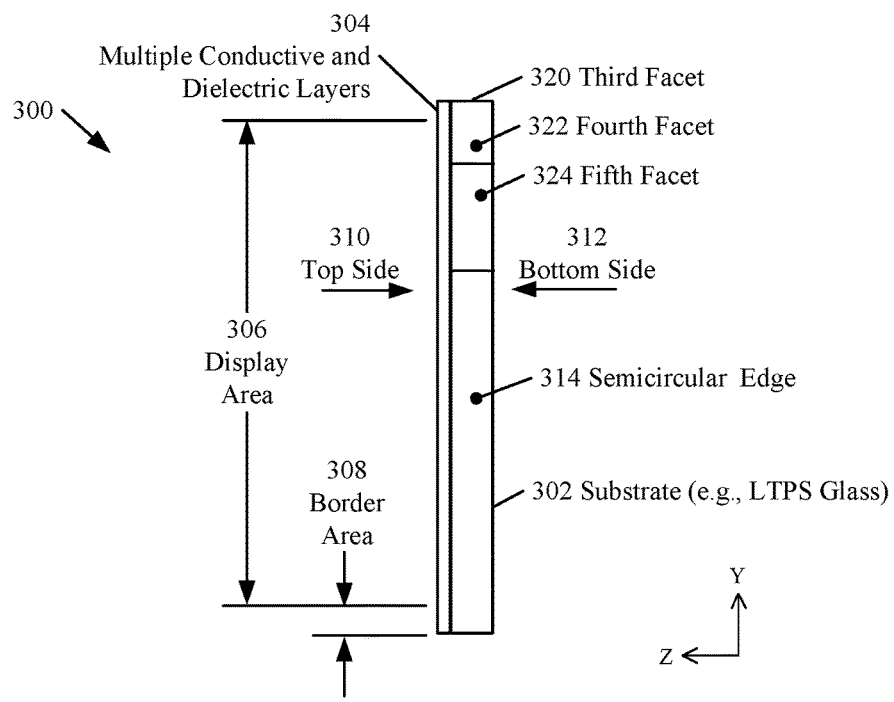
FIG. 3B illustrates a side view of the display panel of FIG. 3A.

FIG. 3A illustrates a plan view of a display panel 300 with a minimum width border area, according to an aspect described herein. FIG. 3B illustrates a side view of the display panel 300 of FIG. 3A. The display panel 300 may include a substrate 302 and multiple conductive and dielectric layers (collectively "upper layers" 304) formed on a topside (e.g., front-side) of the substrate 302. Nothing herein prohibits the formation of one or more conductive and dielectric layers on the backside of the substrate 302. The substrate may be made, for example, of Low Temperature PolySilicon (LTPS) glass.

In one implementation, the substrate 302 may have a perimeter (e.g., a boundary of a closed plane figure) including a semicircular edge 314 (e.g., a curvilinear segment) and a plurality of facets 316, 318, 320, 322, 324 (e.g., flattened surfaces, planar sides, plane surfaces, linear segments). Each adjacent pair of the plurality of facets 316, 318, 320, 322, 324 may be adjoined at an obtuse angle. In an implementation, the substrate 302 may include a first surface (e.g., topside 310), an opposite second surface (e.g., bottom side 312), and an edge at a perimeter of the substrate, wherein the edge includes a curvilinear segment (e.g., semicircular edge 314) adjoined to a number, N, of linear segments (e.g., the plurality of facets 316, 318, 320, 322, 324), where a value of N can be greater than or equal to two. In the exemplary implementation of FIGS. 3A and 3B, N is equal to five.

A display area 306 may include pixels (e.g., light emitting active pixel circuits) that are active. In one aspect, all of the display area 306 includes pixels that are active. A display area 306 in which all of the display area 306 include pixels that are active may be referred to herein as an active display area. The pixels may fabricated on, in, and/or above the substrate 302 and upper layers 304. The display area 306 may be round. The display area 306 may be centered within the display panel 300. The type of display located in the display area 306 may be fabricated, for example, as a liquid crystal display (backlit, transmissive) or a top emitting organic light emitting diode (OLED) display. Other types of displays are acceptable.

Sizes of wearable devices, such as a smartwatch wearable on a wrist, may vary. The dimensions provided herein are exemplary and not intended to be limiting in any aspect. They are provided to aid a reader in visualizing the exemplary aspects described herein. For example, in some implementations the display area 306 may occupy a diameter from approximately 15 mm to approximately 50 mm, in some implementations, the display area 306 may occupy a diameter of approximately 33 mm; however, a greater or lesser diameter can be acceptable. By way of an additional example, in some implementations, the display area 306 may have from approximately 100×100 to approximately 1000×1000 pixels, in some implementations, the display area 306 may have approximately 320×320 pixels, however, a greater or lesser number of pixels can be acceptable.

By way of example, without any intent to limit the exemplary aspects described herein, a display area 306 with about 320×320 pixels may be accommodated by a display driver (e.g., a display driver chip, a display driver application specific integrated circuit (ASIC)) having approximately three hundred and sixty connections. Accordingly, the surface of the substrate 302 may include approximately three hundred and sixty connection pads to accommodate a display area 306 with about 320×320 pixels. In some implementations, however, the display driver may have connections ranging in number from approximately 4 to approximately 1000, depending on the number of pixels in the display area 306. The lower number of connections to a display driver may be contemplated herein, at least in some part, in view of advancements in circuit integration on glass or plastic that may be envisioned.

Within the display area 306 there may be the transistors and/or diodes that form the display. As appreciated by persons of skill in the art, the display area 306 may be formed of intersecting rows and columns of pixels 330 (e.g., rows and columns of pixels distributed across the display area 306). In the exemplary aspect of FIGS. 3A and 3B, there may be three hundred and twenty rows and three hundred and twenty columns, thereby accommodating 320×320 pixels. Transmission lines may couple to column lines and row lines of pixels (e.g., light emitting active pixel circuits) included within the display area 306. The transmission lines may couple to a plurality of connection pads of the substrate 302. A majority of the plurality of connection pads may couple to column driver lines, while other ones of the plurality of connection pads may couple, for example, to row driver lines, power lines, and/or ground lines (not shown).

In one aspect, a border area 308 may surround the display area 306. In one aspect, the border area 308 may be peripheral to (e.g., outwardly adjacent to, outside of) the display area 306. In one aspect, the border area 308 may occupy an area between an outside edge of the display area 306 and an inside of an outer edge of the substrate 302. The border area 308 may provide for the functions used by the display panel 300 including, for example, distribution of transmission lines (e.g., control lines, display driver lines, power lines, and/or ground lines), on-glass circuitry, and seal borders may be accommodated in the border area 308. Within the border area 308 there may be driver circuits for the rows of the display. Within the border area 308 there may also be circuit traces (e.g., conductive interconnects, contact metal) coupled to each of the columns and rows of the display area 306. Accordingly, the border area 308 may include transmission lines (e.g., control lines, display driver lines, power lines, and/or ground lines) and/or active peripheral circuits (e.g., driver circuits). In some implementations, the border area 308 may have a width of approximately 0.2 mm to approximately 3 mm, in some implementation, the border area 308 may have a width of approximately 1.5 mm; other widths are acceptable. For example, if, in the implementation of FIG. 3, the display area 306 had a diameter of approximately 33 mm and the border area 308 had a width of approximately 1.5 mm, the substrate 302 of the display panel 300 of exemplary FIG. 3 may be about 36 mm in diameter. In other implementations, the diameter of the substrate 302 of the display panel 300 may range from approximately 15 mm to approximately 60 mm. Other sizes and shapes of substrates and display panels can be fabricated in accordance with the aspects described herein.

In the aspect of FIG. 3, the edge of the substrate 302 includes a plurality of flattened surfaces (e.g., planar sides, plane surfaces, linear segments), referred to herein as "facets." A facet may be considered as one side of a thing that has many sides. The facet may truncate (e.g., abbreviate, shorten) a shape of the thing on which the facet resides. In an aspect, because, for example, the facet truncates the shape of the thing on which the facet resides, the facet may not protrude from the thing on which the facet resides.

The substrate of FIG. 3, for example, has eight sides (or edges) including a topside 310, a bottom side 312, a semicircular edge 314, a first facet 316, a second facet 318, a third facet 320, a fourth facet 322, and a fifth facet 324. Five facets are shown for illustrative purposes. In some implementations there may be two or more facets. In some implementations, the number of facets may range from about 2 to about 10 facets, or about 2 to about 6 facets. Other ranges in the number of facets are acceptable. The number of facets may depend on many factors including, for example, the diameter of the substrate, the length of the facets, the density of connection pads, the number of connection pads adjacent to each facet, etc. In one aspect, each facet may be comprised of a straight segment having opposing endpoints. Adjacent facets may be adjoined to one to another at the opposing endpoints, or substrate material may be located between the opposing endpoints of adjoined adjacent facets. The facets at the ends of the plurality of facets 316, 318, 320, 322, 324 may be adjoined with a corresponding endpoint of the semicircular edge 314. In an aspect, substrate material may be located between the facet at the end of the plurality of facets adjoined with the corresponding endpoint of the semicircular edge 314.

The substrate 302 having the semicircular edge 314, the first facet 316, the second facet 318, the third facet 320, the fourth facet 322, and the fifth facet 324 maintains a generally round shape even with the flattened edges that truncate the overall roundness of the substrate 302. Accordingly, a substrate having a plurality of facets, such as the substrate 302 illustrated in FIG. 3 may be referred to herein as a substantially round substrate.

Figure 4:
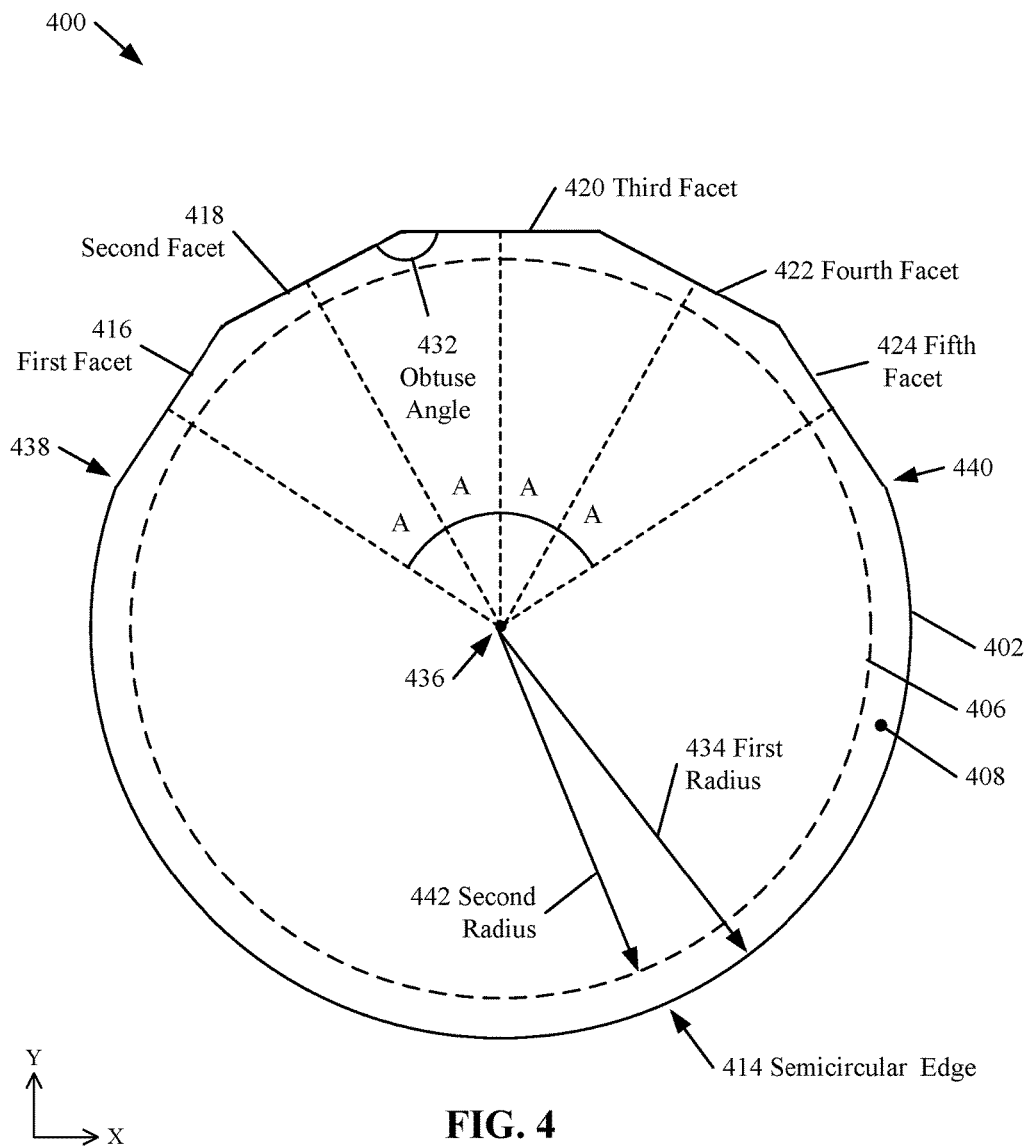
FIG. 4 illustrates a plan view of a substrate, similar to a substrate of FIG. 3, according to an aspect described herein.

FIG. 4 illustrates a plan view of a substrate 402, similar to the substrate 302 of FIG. 3, according to an aspect described herein. The substrate 402 includes a display area 406, a border area 408, a semicircular edge 414, and five facets 416-424 (e.g., planar sides, plane surfaces, flattened edges, linear segments). In the exemplary aspect of FIG. 4, each of the five facets 416-424 are separated from one another by a given angular amount "A". Each adjacent pair of facets are adjoined at an obtuse angle 432 (e.g., an angle greater than 90 degrees but less than 180 degrees). In other words, the plurality of facets 416, 418, 420, 422, 424 may be adjoined along an outer perimeter of a substrate 402, where each adjacent pair of facets 416-424 may be adjoined at an obtuse angle. As used herein, adjoined may mean to be close to and in direct or indirect contact with another thing. In the configuration of FIG. 4, the lengths of all facets are equal and the endpoints of adjacent facets abut one another. Other configurations are acceptable. For example, in one aspect, some or all of the lengths of the facets may not be equal to one another. In one aspect, a rounded portion of the substrate may be located between the endpoints of adjacent facets (in which case, lines parallel to and extending from the adjacent facets would intersect at an obtuse angle). In one aspect, the angular separation between some or all of the facets may different from one another.

In the aspect of FIG. 4, the substrate 402 has a first radius 434 measured from a first point 436 (e.g., a center of the substrate) on the substrate 402. The outer edge of the substrate 402 may be formed by a semicircular edge 414 having a first endpoint 438 and a second endpoint 440 adjoined to endpoints of facets adjacent to the first endpoint 438 and the second endpoint 440 of the semicircular edge 414. The semicircular edge 414 may have the first radius 434 measured from the first point 436 on the substrate 402. Each of the plurality of facets 416, 418, 420, 422, 424 may have endpoints lying on a circle having the first radius 434 and an origin of the circle may be coincident with the first point 436 on the substrate 402. Therefore, in one example, the endpoints of the plurality of facets 416, 418, 420, 422, 424 and the semicircular edge 414 of the substrate 402 lie on the same circle. In the aspect of FIG. 4, the first radius 434 may be about 19 mm (half of an exemplary 38 mm diameter of the substrate 402) while the second radius 442 may be about 17.7 mm (allowing for a 1.5 mm border area). In the exemplary implementation of FIG. 4, the difference between the first radius 434 and the second radius 442 may be the width of the border area 408. The dimensions are provided as examples. None of the aspects provided herein are intended to limit the scope of the disclosure. Smaller or larger substrate diameters and border areas are acceptable.

The configurations of FIG. 3 and FIG. 4 may enable a distribution of transmission lines (e.g., control lines, display driver lines, power lines, and/or ground lines) to and from the display panel 300 over a wider angular area than that of the prior art. For example, the configurations of FIG. 3 and FIG. 4 may enable the distribution of transmission lines into the angular area that includes the plurality of facets 416, 418, 420, 422, 424 instead of the narrower angular areas represented by, for example, the flat tire area 110 of FIG. 1 or the tab structure 210 of FIG. 2. For example, in an exemplary case of three hundred and sixty display driver lines, the exemplary aspect of FIG. 4 enables five connection areas (e.g., areas adjacent to the plurality of facets 416, 418, 420, 422, 424) (each having seventy two connection pads) to replace one connection area (e.g., flat tire area 110 in the flat tire configuration or the tab structure 210 in the tab configuration) (each having three hundred and sixty connection pads). Distributing the connection pads among the five connection areas may allow each connection area to occupy a narrower angular distance (e.g., a smaller arc, a smaller arc length) around the circumference of the display panel 400, in comparison to only one connection area. Additionally, distributing the connection pads among the five connection areas may allow each connection area to include fewer connection pads in comparison to only one connection area. Furthermore, the narrower the angular distance, the less the truncation of the substrate. In other words, for a substrate 302, 402 having a given diameter and a given number of connection pads, increasing a quantity of facets 316-324, 416-424, while decreasing a number of connection pads in a group of connection pads, can facilitate a reduction in a width of the border area 308, 408.

For example, accommodating five connection areas (e.g., areas adjacent to the plurality of facets 416, 418, 420, 422, 424), each having seventy two connection pads, may allow the border area 408 to have a width that can be less than the width used to accommodate one connection area having three hundred and sixty connection pads.

Figure 5:
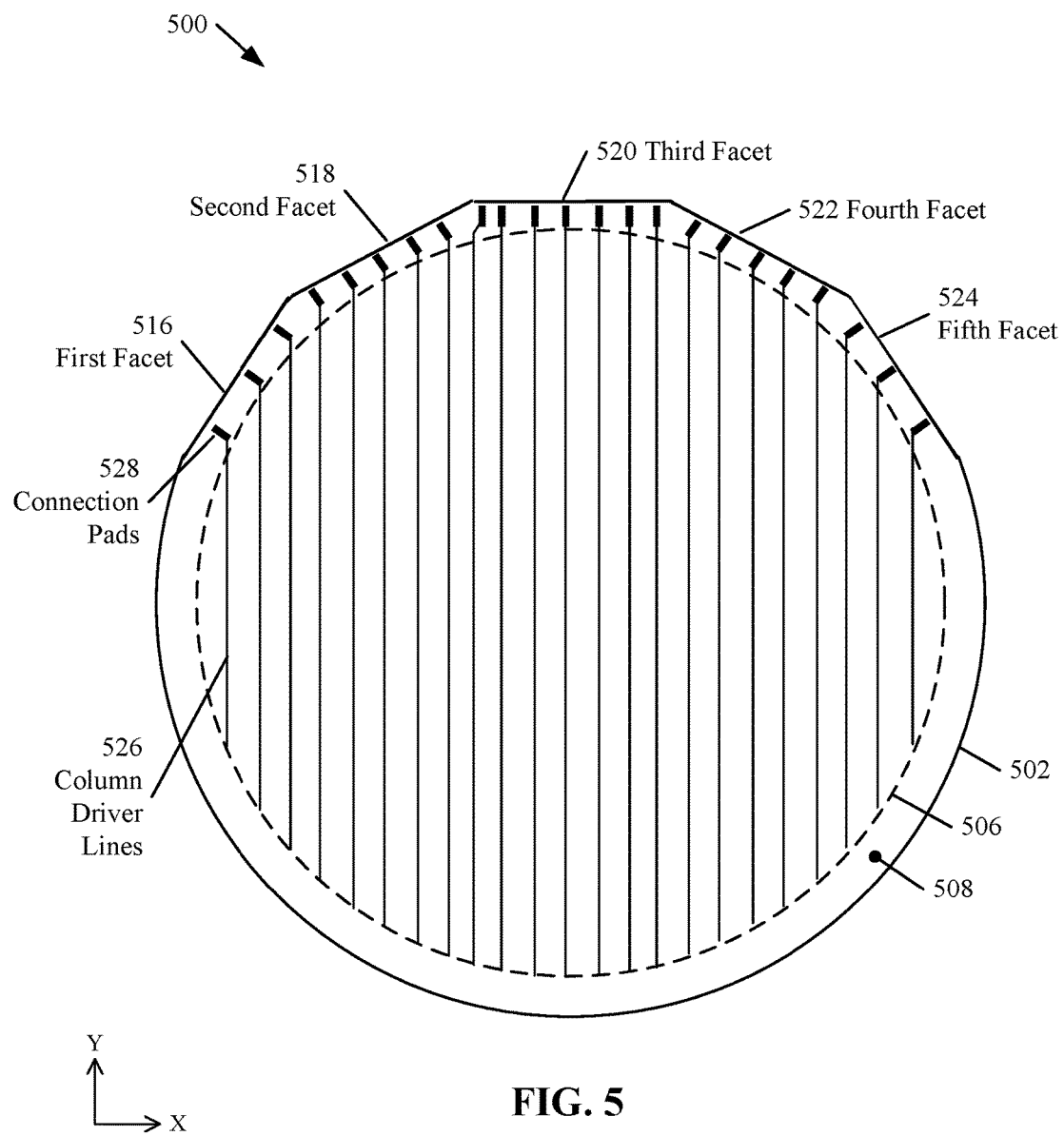
FIG. 5 illustrates a plan view of a substrate, where a sample of transmission lines and connection pads are depicted, according to an aspect described herein.

FIG. 5 illustrates a plan view of a substrate 502, where a sample of transmission lines 526 (e.g., control lines, display driver lines, power lines, and/or ground lines) and connection pads 528 are depicted, according to an aspect described herein. To avoid clutter, row driver lines, power lines, and/or ground lines are not depicted in the display area 506 or the border area 508.

The display panel 500 includes a substrate 502. The edge of the substrate 502 includes a first facet 516, a second facet 518, a third facet 520, a fourth facet 522, and a fifth facet 524. Five facets are shown for illustrative purposes. A smaller or larger number of facets are acceptable. The display panel 500 includes a display area 506. The display area 506 may be round. As appreciated by persons of skill in the art, a display within the display area 506 can be formed of intersecting rows and columns of pixels. Rows of pixels of the display may be coupled to row driver lines (not shown). Columns of pixels of the display may be coupled to transmission lines 526. FIG. 5 portrays a representative sample of transmission lines 526.

In some implementations, each facet 516-524 provides an edge adjacent to which one or more rows of connection pads 528 may be formed. The edge may be flat. The edge may be straight. The connection pads 528 may be formed on the substrate 502 in the border area 508 between the edge of a facet and the display area 506. In the illustration of FIG. 5, one row of connection pads 528 is shown adjacent to the edge of each facet 516-524 to avoid clutter in the drawing. Staggered rows are acceptable. A representative sample of transmission lines 526 is depicted to avoid clutter in the drawing. Each one of the transmission lines 526 may couple to a corresponding one of the connection pads 528. The display panel 500 of FIG. 5 may be, for example, a liquid crystal display (backlit, transmissive) or a top emitting organic light emitting diode (OLED) display, both of which make use of connection pads and transmission lines.

The connection pads 528 may be configured to couple to a connection portion of an arm of a multiple-arm flexible circuit board (e.g., a flexible substrate circuit board, flexible ribbon circuit board, flexible film circuit board). Coupling may be achieved using, for example, anisotropic solder or solder preforms that permit a high density of connections. According to one aspect, one arm per facet may wrap around the edge of the display substrate, between the backside of the substrate and the front side of the substrate. The arm may include a plurality of connection pads. The plurality of connection pads of the arm may be coupled to corresponding connection pads 528 adjacent to the facet.

Figure 6:
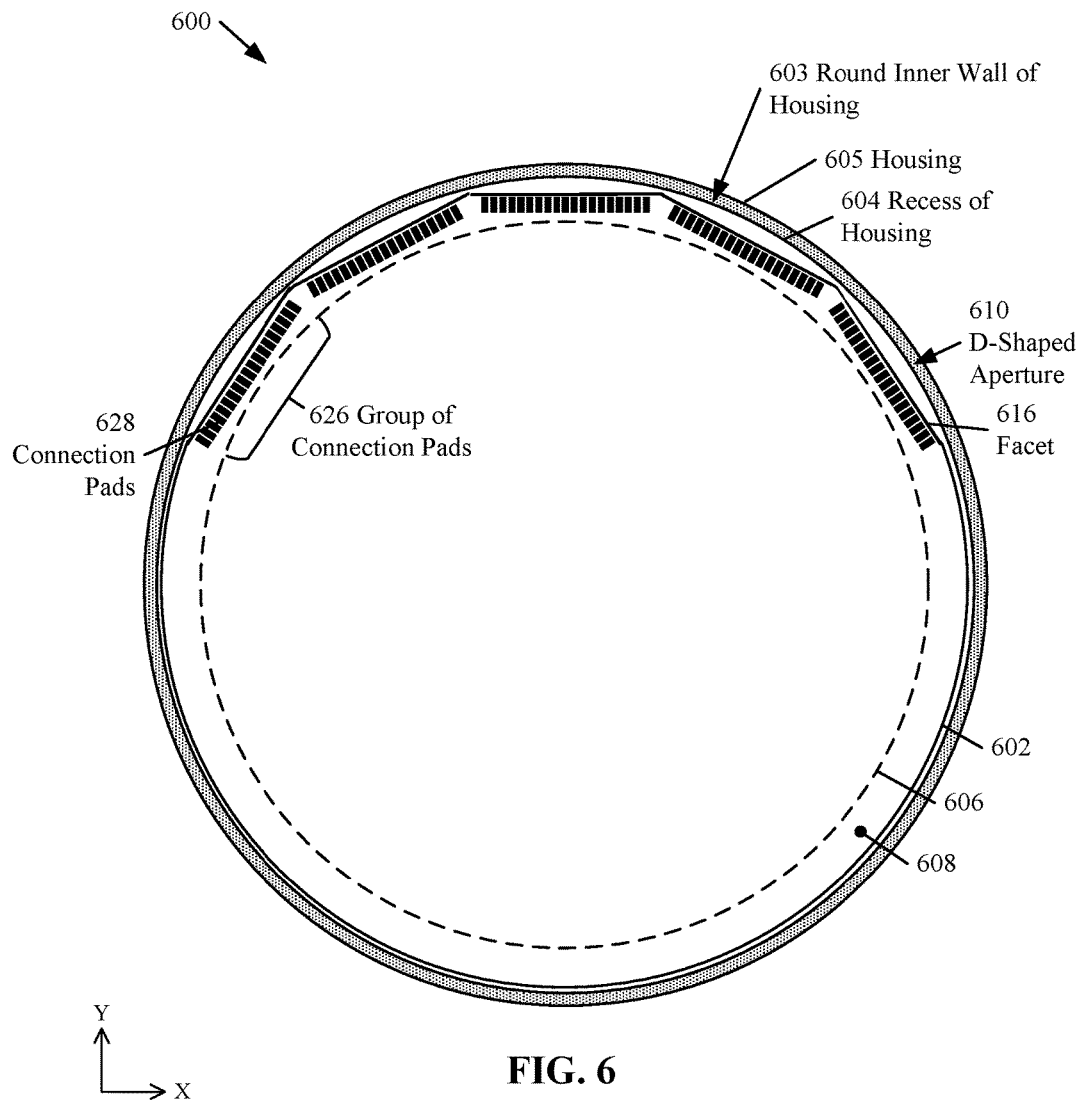
FIG. 6 illustrates a display panel within a recess of a housing, according to an aspect described herein.

FIG. 6 illustrates a display panel 600 within a recess 604 of a housing 605, according to an aspect described herein. In an aspect, the housing 605 has an inner wall 603 that is round (e.g., circular). The display panel 600 may include a substrate 602. The display panel 600 and substrate 602 may be substantially round (e.g., due to inclusion of a plurality of facets 616 on the outer edge of the substrate 602). The exterior of the housing 605 and inner wall 603 of the recess 604 of the housing 605 may be round. A display area 606 may fabricated on the substrate 602. In one aspect, the display area 606 may be round (e.g., circular). The display area 606 may be centered within the display panel 600. The display panel 600 may be centered within the housing 605.

In the example of FIG. 6, the substrate 602 may have a substantially round shape with a plurality of facets 616 disrupting an otherwise uniformly round outer edge of the substrate 602. D-shaped apertures 610, adjacent to each of the plurality of facets 616, may exist between the outer perimeter of the substrate 602 and the inner perimeter of the recess 604. Accordingly, each of the D-shaped apertures 610 may have a straight segment defined by one of the plurality of facets 616 and a curved segment defined by the inner circumference of the recess 604. An arm of a multiple-arm flexible circuit board (e.g., a flexible substrate circuit board, flexible ribbon circuit board, flexible film circuit board) may pass through the D-shaped apertures 610 and extend around (e.g., wrap around) the substrate 602.

The display area 606 may include rows and columns of pixels (not shown) distributed across all of the display area 606. The rows and columns of pixels may be coupled to a plurality transmission lines (e.g., control lines, display driver lines, power lines, and/or ground lines) (not shown). The transmission lines may be coupled to a plurality of connection pads 628. A group 626 (e.g., collection) of connection pads 628 may be formed adjacent to each of the plurality of facets 616. For example, in the exemplary illustration of FIG. 6, a plurality of groups of connection pads (e.g., N groups of connection pads, where N can be greater than or equal to two) may be respectively coupled to the plurality of transmission lines and each group 626 of connection pads 628 may be adjacent one of the plurality of facets 616.

Figure 7:
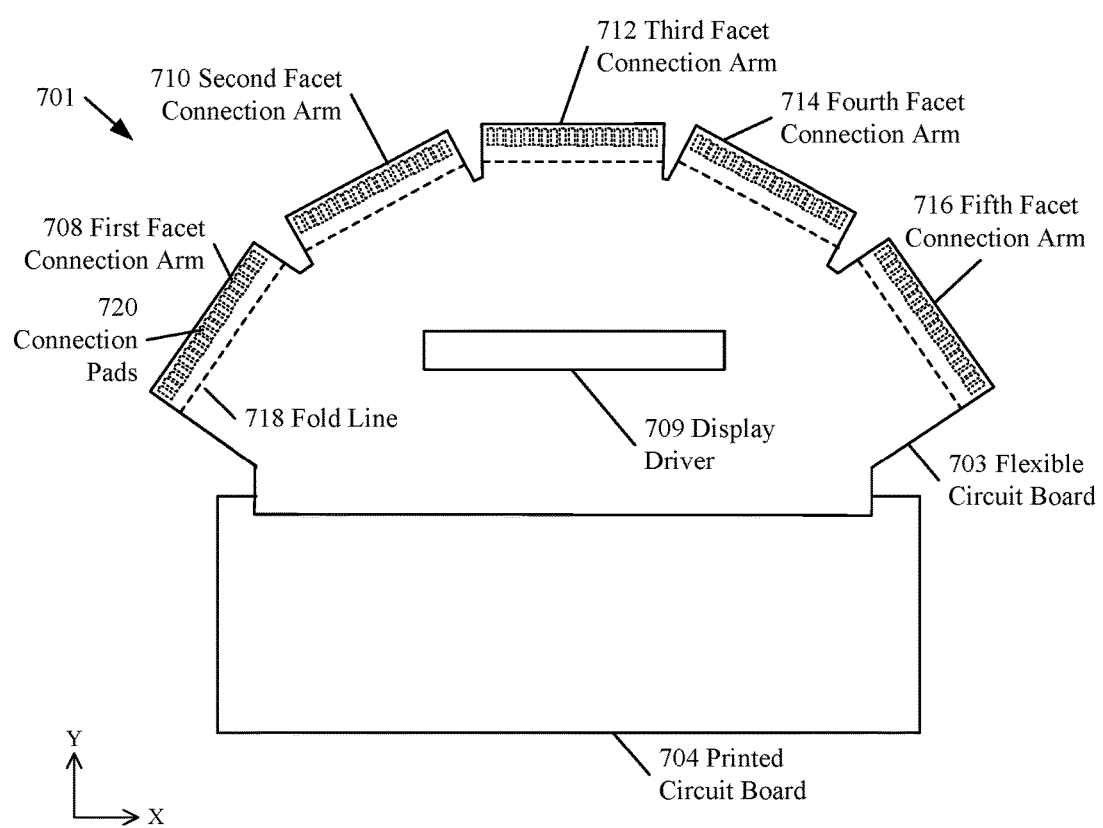
FIG. 7 illustrates a display driver assembly, according to a first aspect described herein.

FIG. 7 illustrates a display driver assembly 701, according to a first aspect described herein. The display driver assembly 701 may include a multiple-arm flexible circuit board, referred to herein as a flexible circuit board 703 (e.g., a flexible substrate circuit board, flexible ribbon circuit board, flexible film circuit board). The display driver assembly 701 may include a display driver 709 (e.g., a display driver chip, a display driver application specific integrated circuit (ASIC)). In an aspect, the display driver 709 may be operationally mounted to the flexible circuit board 703 (e.g., chip-on-flex). In an aspect, the flexible circuit board 703 may include only one display driver 709. The display driver assembly 701 may optionally include a printed circuit board 704. The geometry of the flexible circuit board 703 may be based on the geometry of the display panel (not shown) coupled to the flexible circuit board 703.

The flexible circuit board 703 may include conductive traces coupled to connection pads 720 (e.g., bond pads) at the periphery of each arm extending from the flexible circuit board 703. In the exemplary illustration of FIG. 7, five arms are shown: first arm 708, second arm 710, third arm 712, fourth arm 714, and fifth arm 716. Each arm in the plurality of arms 708-716 may be folded about a predesignated fold line 718. In the exemplary implementation, each arm in the plurality of arms 708-716 includes one predesignated fold line 718, parallel to an edge of a corresponding (e.g., respective) facet, to facilitate wrapping the plurality of arms 708-716 around an outer edge of a substrate and positioning the flexible circuit board 703 adjacent to a backside of the substrate before connection pads 720 on the plurality of arms 708-716 are coupled to corresponding groups of connection pads on the substrate. Coupling may be achieved, for example, using an anisotropic conductive film (ACF) material.

Figure 8:
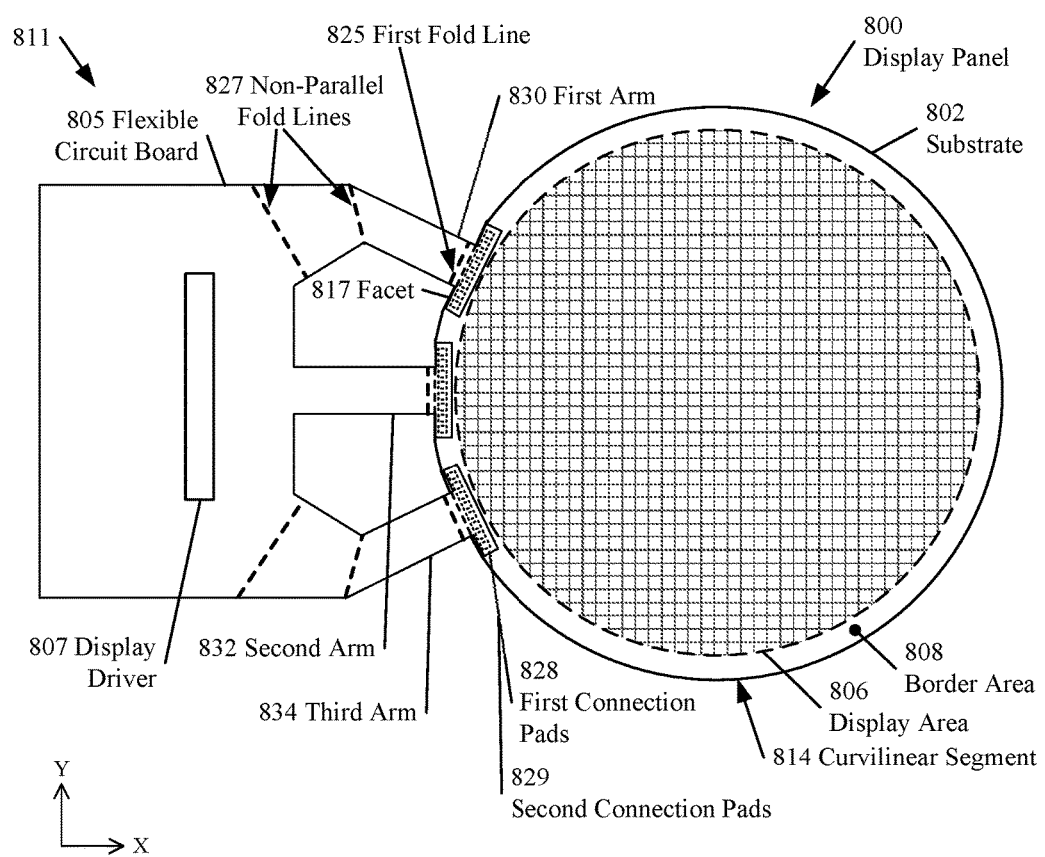
FIG. 8 illustrates a display panel coupled to a display driver assembly, according to an aspect described herein.

FIG. 8 illustrates a device including a display panel 800 coupled to a display driver assembly 811, according to an aspect described herein. The display driver assembly 811 may include a multiple-arm flexible circuit board, referred to herein as a flexible circuit board 805 (e.g., a flexible substrate circuit board, flexible ribbon circuit board, flexible film circuit board). The display driver assembly 811 may include a display driver 807 (e.g., a display driver chip, a display driver application specific integrated circuit (ASIC)). In an aspect, the display driver 807 may be operationally mounted to the flexible circuit board 805 (e.g., chip-on-flex). In an aspect, the flexible circuit board 805 may include only one display driver 807. The display driver assembly 811 may optionally include a printed circuit board (not shown). The geometry of the flexible circuit board 805 may be based on the geometry of the display panel 800 coupled to the flexible circuit board 805.

In the exemplary implementation of FIG. 8, the display panel 800 may include a substrate 802. By way of example, the substrate 802 may include a display area 806 (e.g., active pixel circuit area) having a diameter of approximately 15 mm to approximately 50 mm, in some implementations, the display area 806 may occupy a diameter of approximately 33 mm; however, a greater or lesser diameter is acceptable.

The illustration of FIG. 8 provides an example of a flexible circuit board 805 that may be coupled (e.g., bonded) to the substrate 802 (e.g., flex-to-glass bonding) on, for example, a flat stage before folding the flexible circuit board 805 around the edge of the substrate 802. In the illustration of FIG. 8, the flexible circuit board 805 includes a plurality of facets 817. In the illustration of FIG. 8, the flexible circuit board 805 includes a first arm 830, a second arm 832, and a third arm 834, collectively referred to herein as a plurality of arms 830, 832, 834. In the illustration of FIG. 8, first connection pads 828 of the substrate 802 and second connection pads 829 of the flexible circuit board 805 are shown in an overlapped state. After the second connection pads 829 of the flexible circuit board 805 are bonded to the first connection pads 828 of the substrate 802, each of the plurality of arms 830, 832, 834 of the flexible circuit board 805 may be folded along a fold 825 parallel to an edge of a corresponding (e.g., respective) one of the plurality of facets 817 and a plurality of non-parallel folds 827 along a length of the arm, to facilitate wrapping the plurality of arms 830, 832, 834 around the outer edge of the substrate 802 and positioning the flexible circuit board 805 adjacent to the backside of the display panel 800. The non-parallel folds 827 may act as a joint that can neutralize, mitigate, and/or diminish, torque and/or stress placed on the bonded first connection pads 828, second connection pads 829, and the flexible circuit board 805 itself as the flexible circuit board 805 is wrapped around the edge of the substrate 802. Coupling on a flat stage before folding the flexible circuit board 805 around the edge of the substrate 802 may allow a high and uniform pressure and temperature to be exerted on the flexible circuit board 805 and substrate 802 during coupling without causing damage to the flexible circuit board if flexible circuit board was folded first. Coupling on a flat stage before folding the flexible circuit board 805 can also improve alignment between the flexible circuit board 805 and the substrate 802 and may reduce manufacturing time used to couple the flexible circuit board 805 and the substrate 802.

The flexible circuit board 805 may include conductive traces coupled to the second connection pads 829 (e.g., bond pads) at the periphery of the plurality of arms 830, 832, 834 extending from flexible circuit board 805.

According to one aspect, FIG. 8 may exemplify a device, having a substrate 802, where the substrate 802 may include a perimeter including a curvilinear segment 814 adjoined to the plurality of facets 817, each adjacent pair of the plurality of facets 817 adjoined at an obtuse angle. The substrate 802 may further include a display area 806, including rows and columns of pixels on a surface of the substrate 802. The substrate 802 may further include a border area 808 surrounding the display area 806. The substrate 802 may further include a plurality of first connection pads 828, in the border area 808, coupled to the pixels, and divided into groups of first connection pads 828, each of the groups of first connection pads 828 may be located adjacent to a corresponding one of the plurality of facets 817. The device may further include a flexible circuit board 805 having a plurality of arms 830, 832, 834 corresponding to the plurality of facets 817, each of the plurality of arms 830, 832, 834 coupled to a corresponding one of the groups of first connection pads 828.

In an implementation, the curvilinear segment 814 may be semicircular. The display area 806 may be round. The border area 808 may be annular. As used herein, the term "annular" may mean ring-shaped. According to an aspect, the border area 808 may have a width (e.g., a width in a radial direction from a center of the substrate) and, for a substrate 802 having a given diameter and a given quantity of first connection pads 828, the width of the border area 808 may be reduced by adding facets to the plurality of facets 817 to reduce a number of first connection pads 828 in each of the groups of first connection pads 828. In an implementation, the device may additionally include a display driver 807 operationally coupled to the flexible circuit board 805, wherein the groups of first connection pads 828 adjacent to the plurality of facets 817 may be coupled to the display driver 807 via the plurality of arms 830, 832, 834 of the flexible circuit board 805. In an aspect, the flexible circuit board 805 may include only one display driver 807.

In an implementation, an arm (e.g., first arm 830) of the plurality of arms 830, 832, 834 includes the fold 825 that is parallel to an edge of a corresponding one of the plurality of facets 817 and a plurality of non-parallel folds 827, to facilitate wrapping the arm around the perimeter of the substrate and positioning the flexible circuit board 805 adjacent to a backside of the substrate 802 after the second connection pads 829 of the arm are coupled to corresponding first connection pads 828 of the substrate 802.

Figure 9A:
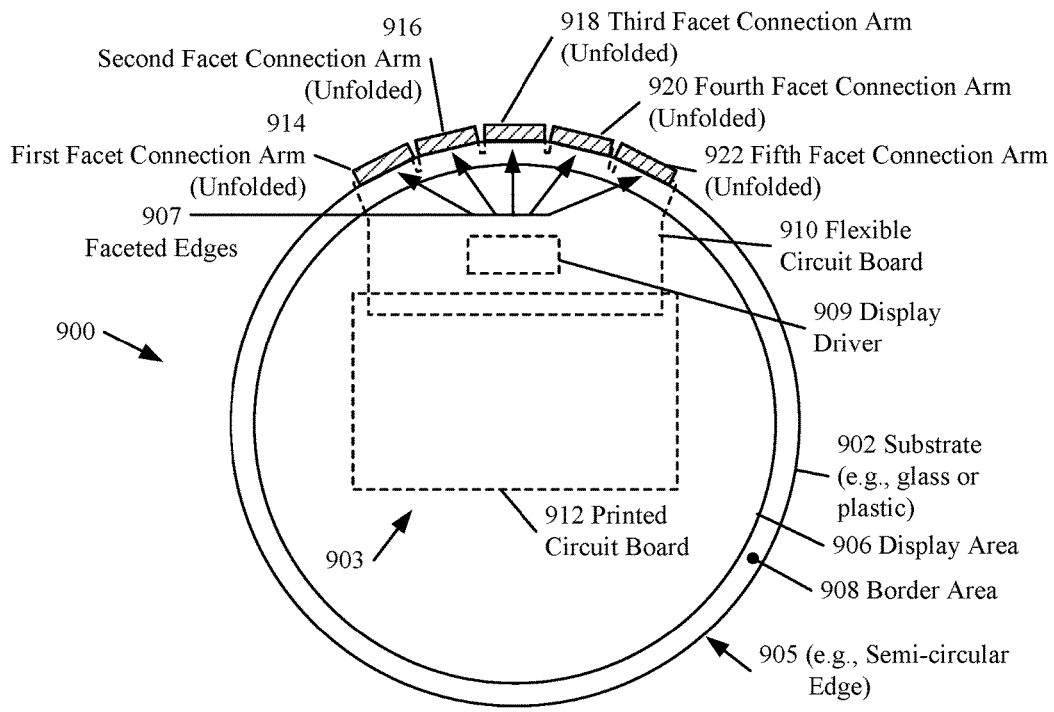
FIG. 9A and FIG. 9B illustrate a display panel positioned above a display driver assembly, according to an aspect described herein.
Figure 9B:
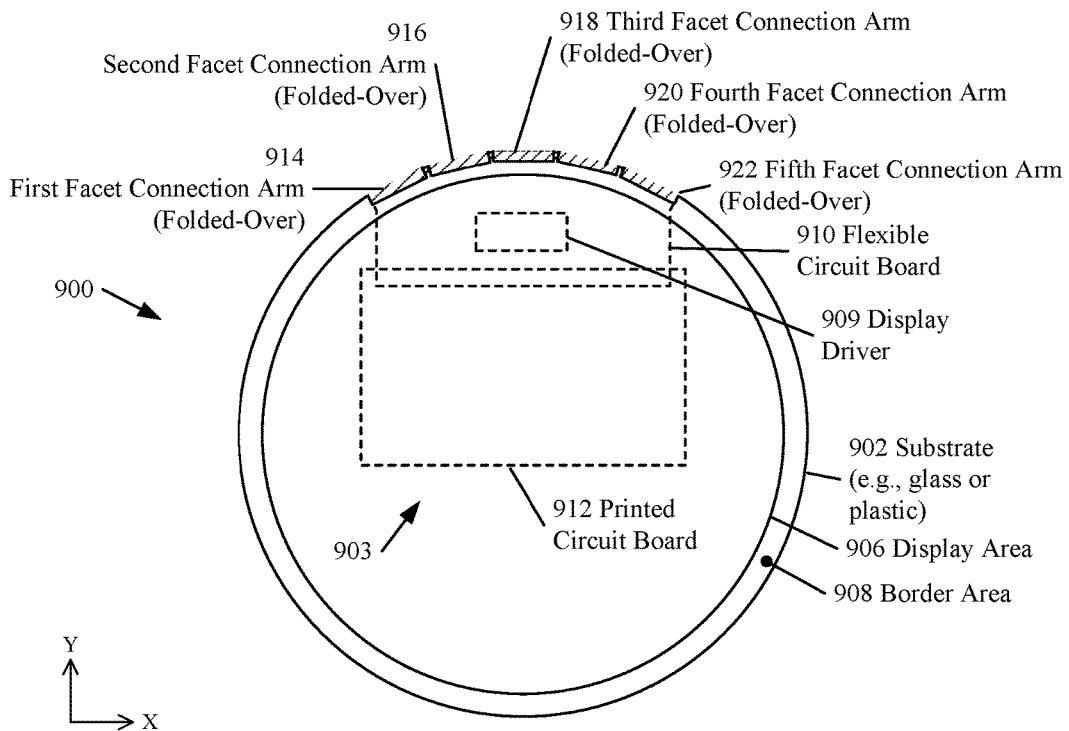

FIG. 9A and FIG. 9B illustrate a display panel 900 positioned above a display driver assembly 903, according to an aspect described herein. The display panel 900 may include a substrate 902 (e.g., glass or plastic) having a semicircular edge 905 adjoined to a plurality of facets 907 (e.g., faceted edges). In an aspect, the substrate 902 includes a perimeter including a curvilinear segment (e.g., the semicircular edge 905) adjoined to the plurality of facets 907 (e.g., facet segments). In an aspect, the plurality of facets 907 may be adjacent to one another (e.g., adjoined directly or indirectly). The display panel 900 may include a display area 906. The display driver assembly 903 may include a flexible circuit board 910 (e.g., a flexible substrate circuit board, flexible ribbon circuit board, flexible film circuit board). The display driver assembly may include a display driver 909 (e.g., a display driver chip, a display driver application specific integrated circuit (ASIC)), coupled to a printed circuit board 912. The portion of the display driver assembly 903 illustrated in dashed lines is positioned below the display panel 900; hidden from view. As used herein, the term below may mean occupying a space under something. A first arm 914, a second arm 916, a third arm 918, a fourth arm 920, and a fifth arm 922 extend out from below the display panel 900. In FIG. 9A, the arms are shown in an unfolded state.

FIG. 9B illustrates the display panel 900 of FIG. 9A positioned above the display driver assembly 903. The difference between FIGS. 9A and 9B is that each of the first arm 914, second arm 916, third arm 918, fourth arm 920, and fifth arm 922 are now illustrated as being folded around the substrate 902, where the folds are parallel to the edges of a corresponding number of a plurality of facets 907. Each of the first arm 914, second arm 916, third arm 918, fourth arm 920, and fifth arm 922 of the flexible circuit board 910 may be coupled (e.g., bonded, electrically connected) to connection pads adjacent to a corresponding facet.

According to one implementation, a device (e.g., a display panel 900) may include a substrate 902 having a border (e.g., a perimeter, an outer circumference) with a plurality of facets 907. Each of the plurality of facets 907 may provide an edge adjacent to which a row of connection pads (e.g., 628, FIG. 6) may be formed. According to one aspect, each arm of the plurality of arms 914-922 of the flexible circuit board 910 may wrap around a corresponding one of the plurality of facets 907. Each arm of the plurality of arms 914-922 of the flexible circuit board 910 may be coupled to connection pads adjacent to a corresponding one of the plurality of facets 907. The device may include a display area 906 on the substrate 902. The substrate 902 may include rows and columns of pixels distributed across the display area 906. The rows and columns of pixels may be coupled to the connection pads.

According to an aspect, each arm of the plurality of arms 914-922 may include only one fold that is parallel to an edge of a corresponding facet (e.g., a corresponding facet in the plurality of facets 907), to facilitate wrapping each arm around the perimeter of the substrate 902 and positioning the flexible circuit board 910 adjacent to a backside of the substrate 902 before a plurality of second connection pads of each arm are coupled to corresponding first connection pads of the substrate 902.

Figure 10:
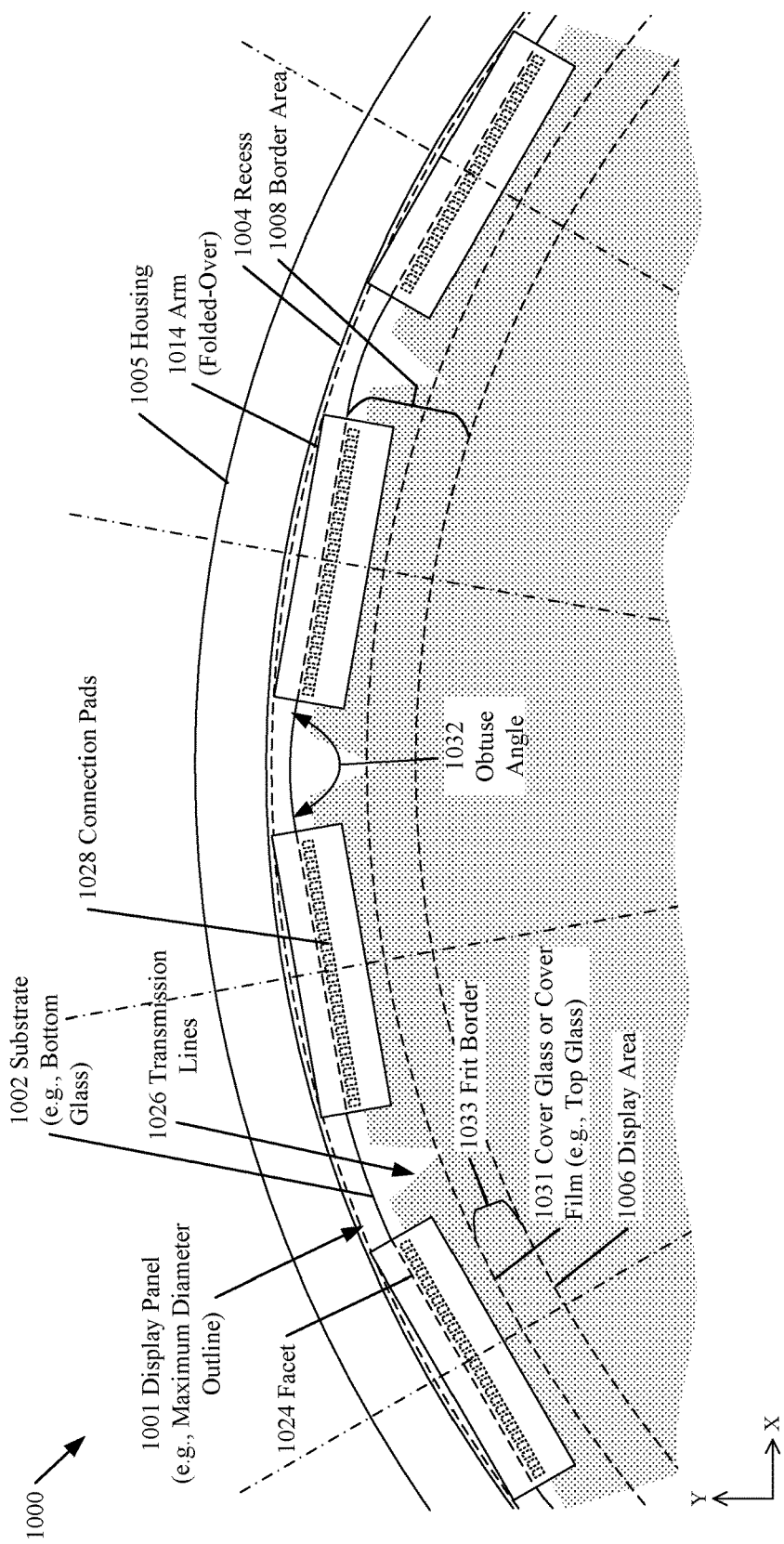
FIG. 10 illustrates an edge portion of a display panel within a recess of a housing, according to an aspect described herein.

FIG. 10 illustrates an edge portion of a display panel 1001 within a recess 1004 of a housing 1005 according to an aspect described herein. In the exemplary implementation of FIG. 10, the diameter of the recess 1004 of the housing 1005 may be about 36 mm. The maximum outer diameter of the display panel 1001 may be about 35.9 mm (e.g., to provide about a 0.05 mm gap between the inside of the recess 1004 of the housing 1005 and an exterior edge of the display panel 1001). In an alternate exemplary implementation, the maximum outer diameter of the display panel 1001 may be about 35.8 mm (e.g., to provide about a 0.1 mm gap between the inside of the recess 1004 of the housing 1005 and an exterior edge of the display panel 1001). The display panel 1001 is illustrated as a dashed line in FIG. 10 for a visual reference. The display panel 1001 may be truncated to take the same, or similar, exterior profile as that of the substrate 1002, for example, in the area where a plurality of facets 1024 are present on the substrate 1002. Truncation of the display panel 1001 in this way may provide an opening through which an arm of a multiple-arm flexible circuit board may pass (e.g., pass between the inner wall of the housing 1005 and the display panel 1001). In some implementations, the diameter of the recess 1004 of the housing 1005 (e.g., the inner diameter of a housing 1005) may range from approximately 15 mm to approximately 60 mm, while the outer diameter of a housing 1005 may range from approximately 20 mm to approximately 65 mm. In one aspect, adjacent pairs of the plurality of facets 1024 may be adjoined at an obtuse angle 1032.

The illustration of FIG. 10 depicts arms 1014 of a multiple-arm flexible circuit board (e.g., a flexible substrate circuit board, flexible ribbon circuit board, flexible film circuit board), where the arms 1014 are wrapped around the plurality of facets 1024 of the substrate 1002 (e.g., glass or plastic). The arms 1014 (additional arms may be present but are not shown due to space limitations) may be from a display driver assembly (not shown). In the exemplary implementation of FIG. 10, the substrate 1002 (e.g., bottom glass) may have a diameter of about 35.2 mm.

The substrate 1002 (e.g., bottom glass) may have one semicircular edge (not shown) coupled to the plurality of facets 1024. The substrate 1002 may include a display area 1006 (also referred to as an active area). The display area 1006 may include pixels (e.g., light emitting active pixel circuits) that are active. That is, the pixels may be configured to be an active display area. In the exemplary implementation of FIG. 10, the display area 1006 may be about 31.6 mm in diameter. The arms 1014 (part of the multiple-arm flexible circuit board) extend out from under the backside of the substrate 1002. In FIG. 10, the arms 1014 are shown a folded state. That is, the arms 1014 are illustrated as being folded around (e.g., wrapped around) the substrate 1002, where the folds are parallel to the edges of corresponding facets in the plurality of facets 1024. The edges of the corresponding facets in the plurality of facets 1024 are shown in phantom (broken) lines.

In an implementation, each of the arms 1014 may include about one hundred leads or traces. By way of example, in some implementations, the width of a lead or trace may be about 20 um+/−5 um while the spacing may also be about 20 um+/−5 um. In some implementations, the width of the lead or trace plus an adjoining space may be about 40 um or less. In an implementation, the display area 1006 (e.g., the active area) may be about 31.6 mm in diameter. The display panel 1001 may include a cover glass or cover film 1031 (e.g., top glass of an LCD or thin film packaging outline). The cover glass or cover film 1031 may be positioned over the substrate 1002 and may protect the surface and circuitry of the substrate 1002. In an implementation, the diameter of the cover glass or cover film 1031 is about 33 mm.

A frit border 1033 (e.g., a frit layer in the form of a ring, an annular frit border) of about 0.7 mm may span from an outer edge of the cover glass or cover film 1031 inward toward the edge of the display area 1006. As appreciated by persons of skill in the art, frit may be a mixture of silica and fluxes that is fused at high temperature to make glass. The frit border 1033 may be the area (e.g., sealing area) where the substrate 1002 (e.g., bottom glass) and the cover glass or cover film 1031 are sealed together. In an implementation, a maximum distance between the outer edge of the cover glass or cover film 1031 and an edge of a facet in the plurality of facets 1024 may be about 0.9 mm. Of the maximum distance, a distance of about 0.3 mm may be left between edges of the arms 1014, in a folded state, and the edge of the cover glass cover glass or cover film 1031. Therefore, a distance of about 0.6 mm between the edges of the arms 1014, in the folded state, and the edge of the facet in the plurality of facets 1024 may remain.

The arms 1014 may have a minimum bend radius. The minimum bend radius may increase the distance between an edge of the recess 1004 and an edge of a facet in the plurality of facets 1024. The minimum bend radius may depend on many factors, including, the thickness of the material used to fabricate the arms 1014 (e.g., the material used to fabricate the flexible circuit board), the thickness and types of conductive material (e.g., metal) used to fabricate the transmission lines (e.g., control lines, display driver lines, power lines, and/or ground lines) in the arms 1014, etc. In some implementations, the minimum bend radius may range from approximately 0.1 mm to approximately 0.6 mm. In some implementations, the minimum bend radius may be approximately 0.3 mm to approximately 0.4 mm.

To avoid cluttering the drawings, the illustrated number of connection pads 1028 is only exemplary; also, the plurality of transmission lines 1026 (e.g., control lines, display driver lines, power lines, and/or ground lines) coupling the plurality of pixels of a substrate to the connection pads 1028 on the substrate are shown collectively as a shaded area occupying the display area 1006 and portions of a border area 1008 between the edge of the display area 1006 and the edge of the substrate adjacent to a facet in the plurality of facets 1024.

Figure 11A:
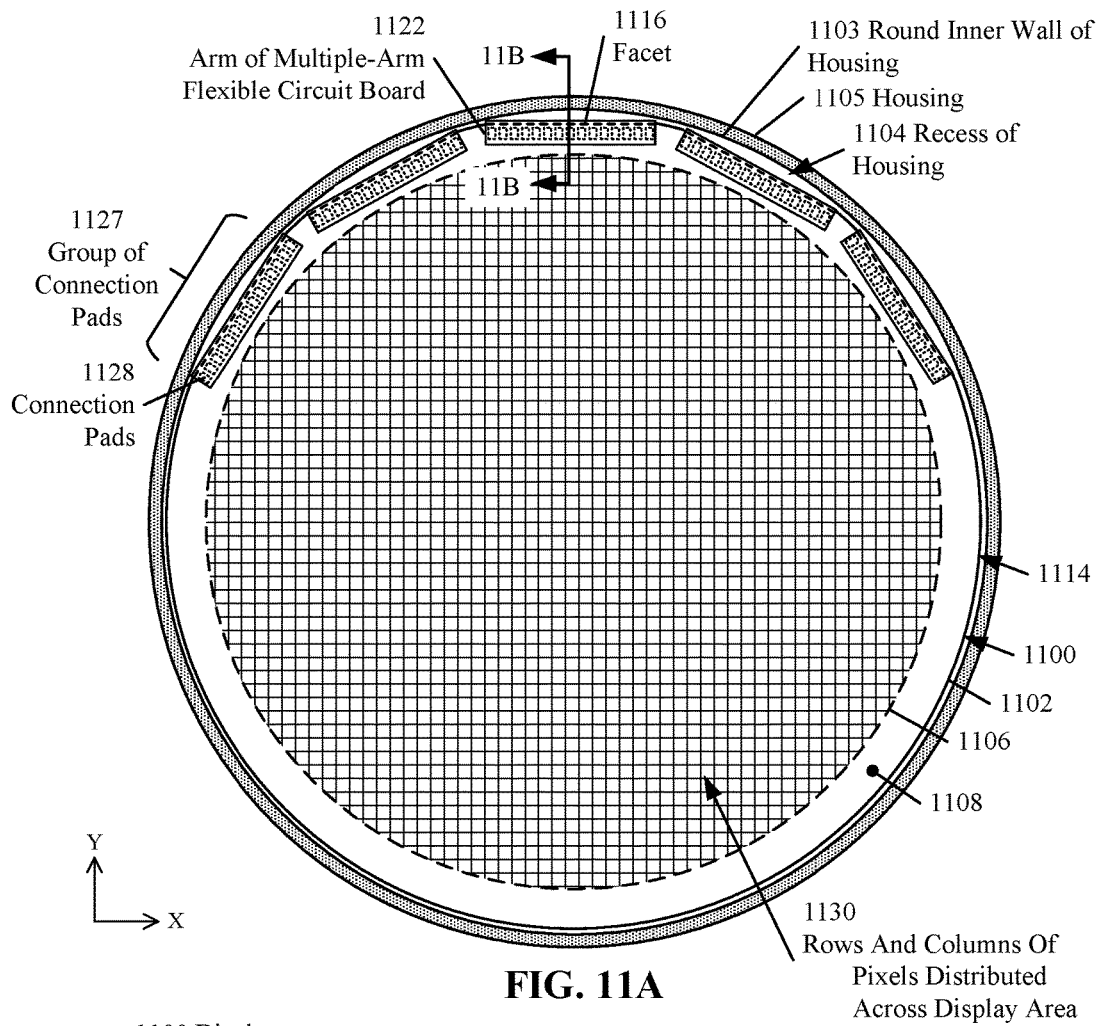
FIG. 11A is a plan view of a display panel within a recess of a housing, according to an aspect described herein.
Figure 11B:
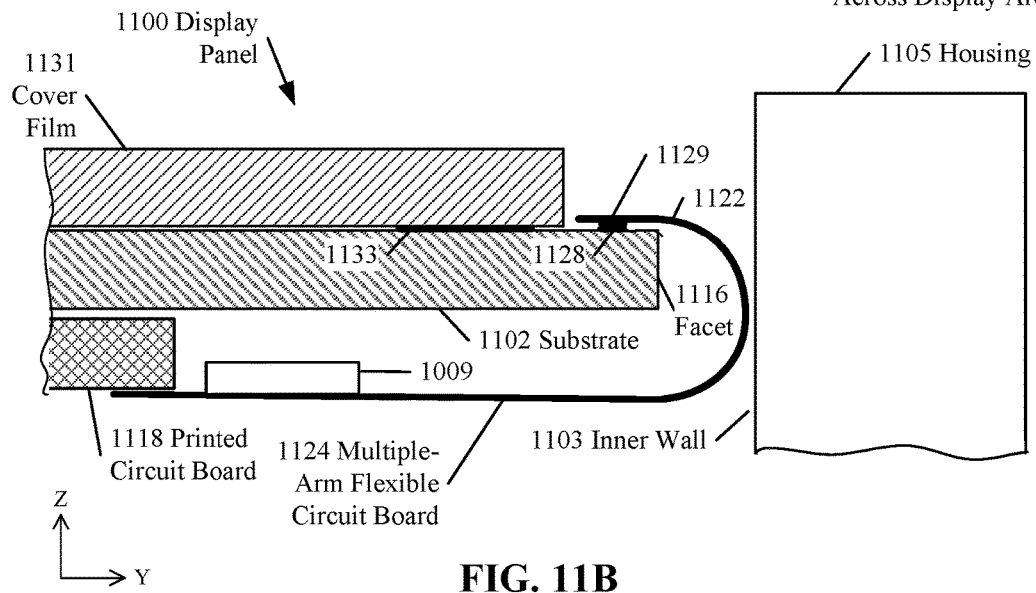
FIG. 11B is a cross-section view taken along the line marked 11B-11B in FIG. 11A.

FIG. 11A is a plan view of a display panel 1100 within a recess 1104 of a housing 1105, according to an aspect described herein. FIG. 11B is a cross-section view taken along the line marked 11B-11B in FIG. 11A. In an aspect, the exterior of the housing 1105 and inner wall 1103 of the recess 1104 of the housing 1105 may be round. The display panel 1100 may include a substrate 1102. In the example of FIG. 11A, the substrate 1102 may have a substantially round shape with a plurality of facets 1116 disrupting an otherwise uniformly round outer edge of the substrate 1102. Five facets are illustrated for exemplary purposes. In the example of FIG. 11A, the substrate 1102 (e.g., bottom glass) may have one curvilinear segment 1114 (e.g., a semicircular edge) coupled to the plurality of facets 1116.

A display area 1106 may fabricated on the substrate 1102. In one aspect, the display area 1106 may be round (e.g., circular). In another aspect, the display area 1106 may be non-round (e.g., closed plane figure bordered by linear and/or curvilinear segments). The display area 1106 may include rows and columns of pixels 1130 distributed across all of the display area 1106. The rows and columns of pixels 1130 may be coupled to a plurality transmission lines (e.g., control lines, display driver lines, power lines, and/or ground lines) (not shown). The transmission lines may be coupled to a plurality of connection pads 1128. A group (e.g., a collection) of connection pads 1128 may be formed adjacent to each of the plurality of facets 1116. In other words, in the exemplary illustration of FIG. 11A, a plurality of groups 1127 of connection pads may be coupled to a corresponding plurality of transmission lines and each of the plurality of groups 1127 of connection pads 1128 may be adjacent one of the plurality of facets 1116.

The illustration of FIG. 11A depicts a plurality of arms 1122 (five arms are shown for illustrative purposes) of a flexible circuit board 1124 (e.g., a flexible substrate circuit board, flexible ribbon circuit board, flexible film circuit board), where each of the plurality of arms 1122 extends around (e.g., wraps around) a corresponding one of the plurality of facets 1116 of the substrate 1102. The flexible circuit board 1124 may be coupled to a printed circuit board 1118 positioned adjacent to a backside of the substrate 1102. The plurality of arms 1122 of the flexible circuit board 1124 is shown a folded state. That is, the plurality of arms 1122 are illustrated as being folded around (e.g., wrapped around) the substrate 1102, where the folds are parallel to the edges of corresponding facets in the plurality of facets 1116. In one implementation, each of the arms in the plurality of arms 1122 may include about one hundred leads or traces. By way of example only, in some implementations, the width of a lead or trace may be about 20 um+/−5 um while the spacing may also be about 20 um+/−5 um. In some implementations, the width of the lead or trace plus an adjoining space may be about 40 um or less. In the exemplary implementation of FIG. 11, the display area 1106 is about 31.6 mm in diameter.

The display panel 1100 may include a cover glass or cover film 1131 (e.g., top glass of an LCD or thin film packaging outline). The cover glass or cover film 1131 may be positioned over the substrate 1102 and may protect the surface and circuitry of the substrate 1102. A frit layer 1133 (e.g., a frit layer in the form of a ring, an annular frit border) may span from an outer edge of the cover glass or cover film 1131 inward toward the edge of the display area 1106. As appreciated by persons of skill in the art, frit may be a mixture of silica and fluxes that is fused at high temperature to make glass. The frit layer 1133 may seal the substrate 1102 (e.g., bottom glass) and the cover glass or cover film 1131 together. A plurality of connection pads 1128 may be positioned between an outer edge of a facet in the plurality of facets 1116 and the frit layer 1133. The plurality of connection pads 1128 may be positioned beneath the plurality of arms 1122.

In one aspect, a device (e.g., a display panel, a smartwatch) may include a substrate 1102 having a perimeter including a curvilinear segment 1114 and a plurality of facets 1116, each adjacent pair of the plurality of facets 1116 may be adjoined at an obtuse angle. The device may further include a display area 1106. In one aspect, the display area 1106 may include rows and columns of pixels 1130 on a surface of the substrate 1102. The device may further include a border area 1108, on the substrate 1102, surrounding the display area 1106. In one aspect, a plurality of connection pads 1128 may be located in the border area 1108. In one aspect, the plurality of connection pads 1128 may be coupled to the pixels 1130. In one aspect, the plurality of connection pads may be divided into a plurality of groups 1127 of connection pads 1128, each of the plurality of groups 1127 of connection pads may be adjacent to a corresponding one of the plurality of facets 1116. The device may further include a flexible circuit board 1124 having a plurality of arms 1122 corresponding to the plurality of facets 1116, each of the plurality of arms 1122 may be wrapped around a corresponding facet of the plurality of facets 1116 (e.g., between a backside of the substrate 1102 and a front side of the substrate 1102). Each of the plurality of arms 1122 may be coupled to a corresponding one of the plurality of groups 1127 of connection pads 1128. In an implementation, the device may further include a display driver 1109, wherein transmission lines from the groups of connection pads adjacent to the plurality of facets 1116 are coupled to the display driver 1109 via the plurality of arms of 1122 the flexible circuit board 1124. In an aspect, the device may include only one display driver 1109. In an aspect, the flexible circuit board 1124 includes the display driver 1109.

In another aspect, a device (e.g., an electronic device, a display panel, a smartwatch) may include a substrate 1102 including a first surface, an opposite second surface, and an edge at a perimeter of the substrate. The edge may include a curvilinear segment 1114 adjoined to N facets (e.g., planar sides, plane surfaces, flattened edges, linear segments), where N is greater than or equal to two. In one aspect, adjacent pairs of the N facets may be adjoined at an obtuse angle. The substrate 1102 may include a plurality of pixels 1130, distributed in rows and columns on the first surface of the substrate 1102. The plurality of pixels 1130 may be distributed in a display area 1106 of the substrate 1102. The device may further include a plurality of groups 1127 (alternatively referred to herein as N groups 1127, where a value of N may be greater than or equal to two) of connection pads 1128 on the first surface of the substrate 1102. The N groups 1127 of connection pads 1128 may be located within a border area 1108 peripheral to the display area 1106. Each of the N groups 1127 of connection pads 1128 may be positioned adjacent to a corresponding one of the N facets (e.g., a respective facet in the plurality of facets 1116). The device may further include a plurality of transmission lines (e.g., control lines, display driver lines, power lines, and/or ground lines), coupling the plurality of pixels 1130 to the N groups 1127 of connection pads 1128. The device may further include a flexible circuit board 1124 having a plurality of arms (e.g., a flexible circuit board configured with N arms, where a value of N is greater than or equal to two). According to one aspect, each of the N arms may be coupled to a corresponding one of the N groups 1127 of connection pads 1128.

In some aspects, the curvilinear segment 1114 may be semicircular. In some aspects the display area 1106 may be round. In some aspects, for a substrate 1102 having a first diameter and a first number of connection pads 1128, increasing a quantity of facets (e.g., a number, N, of facets) in the plurality of facets 1116, while decreasing a number of connection pads 1128 in each of the N groups 1127 of connection pads 1128, reduces a width of the border area 1108.

In some aspects, each of the N arms may include one fold, where the one fold is parallel to an edge of a corresponding facet. In some aspects, each of the N arms may include only one fold, where the one fold is parallel to an edge of a corresponding facet. The one fold, parallel to the edge of the facet, may facilitate wrapping the N arms around the edge of the substrate 1102 and positioning the flexible circuit board 1124 adjacent to a backside of the substrate 1102, before the N arms are coupled to the N groups 1127 of connection pads 1128.

In some aspects, each of the N arms includes one fold parallel to an edge of a corresponding facet and a plurality of non-parallel folds, to facilitate wrapping the N arms around the edge of the substrate 1102 and positioning the flexible circuit board 1124 adjacent to a backside of the substrate after the N arms are coupled to the N groups 1127 of connection pads 1128.

Exemplary Display Panel with Flexible Circuit Board

Figure 12:
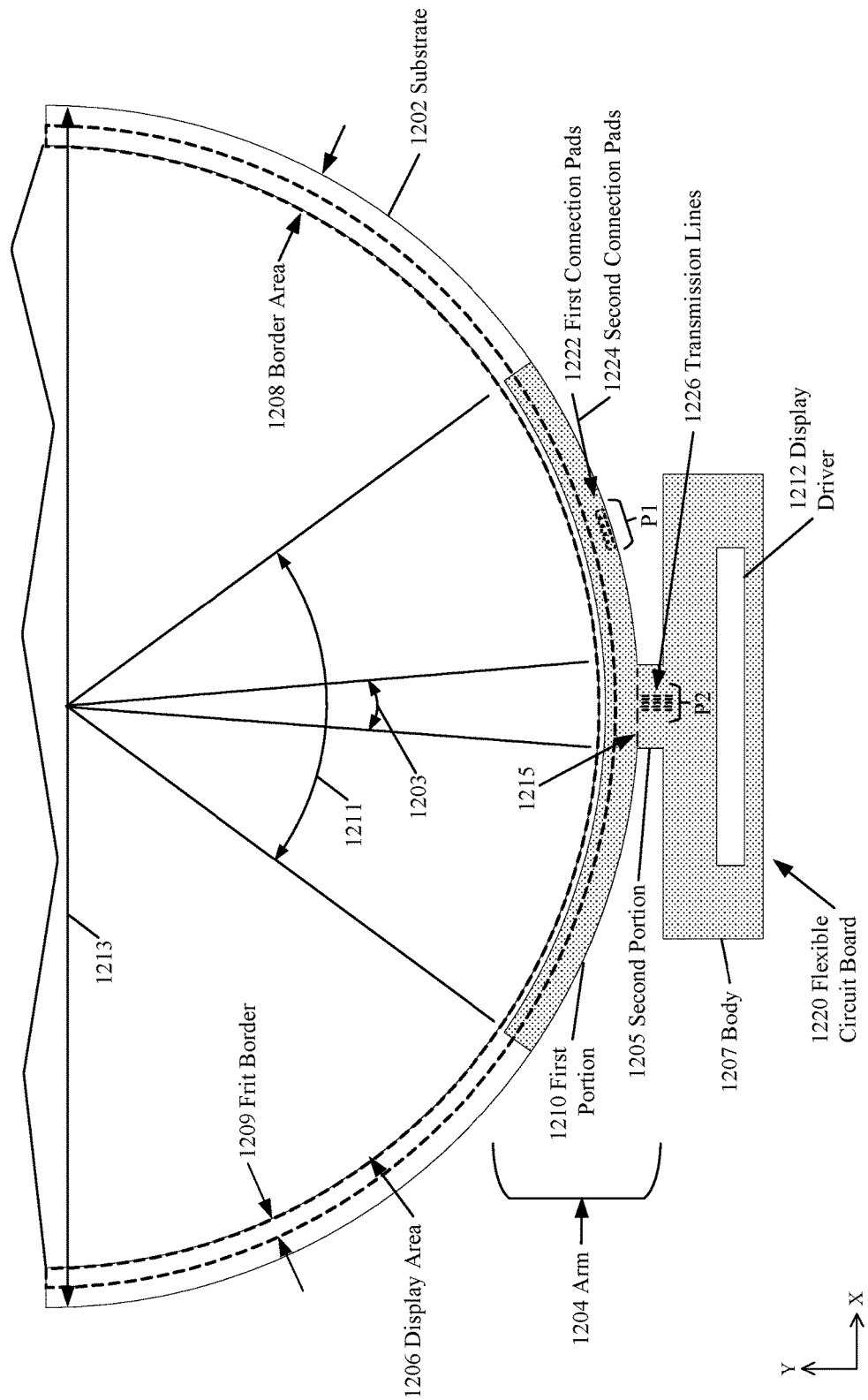
FIG. 12 illustrates a partial view of a substrate bonded to a flexible circuit board, according to an aspect described herein.

FIG. 12 illustrates a partial view of a substrate 1202 bonded to a flexible circuit board 1220 (e.g., a flexible substrate circuit board, flexible ribbon circuit board, flexible film circuit board), according to an aspect described herein. The flexible circuit board 1220 may include a single arm. The substrate 1202 is shown in partial view to permit more detailed observation of the flexible circuit board 1220.

The substrate 1202 may be referred to as a "bottom glass." In some implementations, an outer diameter 1213 of the substrate 1202 may range from approximately 15 mm to approximately 60 mm. In an implementation, the substrate 1202 (e.g., bottom glass) may have an outer diameter 1213 of about 35.9 mm. According to one implementation the substrate 1202 (e.g., bottom glass) may have a round or a substantially round shape. In one implementation, the substrate 1202 may have a round outer perimeter (e.g. a circular outer perimeter), for example, the substrate 1202 may have a continuous round edge (e.g., a circular edge) about a circumference of the substrate. In another implementation, the substrate 1202 may include a semicircular edge and may further include an edge comprised of a facet (e.g., a flattened surface). In one example, the facet may be adjacent to a second portion 1205 of an arm 1204 of the flexible circuit board 1220.

The substrate 1202 may include a display area 1206 (also referred to as an active area). The display area 1206 may be round. The display area 1206 may include pixels (not shown) (e.g., light emitting active pixel circuits) that are active (e.g., an active display area). In an implementation, the display area 1206 may be about 32.9 mm in diameter (where 32.9 mm may be arrived at by subtracting two 1.5 mm border area widths from a 35.9 mm overall diameter of a display panel, in consideration of a flexible circuit board 1220 bending radius of about 0.3 mm).

The substrate 1202 may include a frit border 1209. The frit border 1209 may have an annular shape. In an implementation, the frit border 1209 may be about 0.5 mm in width, while the width of an annular border area 1208, between the edge of the display area 1206 and the edge of the substrate 1202, may be about 1.2 mm.

The substrate 1202 may include an annular border area 1208 that is peripheral to the display area 1206. Within the annular border area 1208 there may be a plurality of first connection pads 1222. A small percentage of a total number of first connection pads 1222 is shown to avoid cluttering the illustration of FIG. 12. The first connection pads 1222 may couple to corresponding second connection pads 1224 on the flexible circuit board 1220 to interface to a display driver 1212.

By way of example, a display area 1206 configured to accommodate a 320×320 pixel display may utilize a display driver 1212 having three hundred and sixty interconnections. Accordingly, at least three hundred and sixty first connection pads 1222 may be arranged in a portion of the annular border area 1208 to couple to the corresponding second connection pads 1224 of a first portion 1210 of the arm 1204 of the flexible circuit board 1220.

The second connection pads 1224 may overlap the first connection pads 1222. According to one exemplary implementation, the first connection pads 1222 and second connection pads 1224 may be 0.080×0.100 mm pads with a center-to-center pitch of about 0.100 mm. In an implementation, the first connection pads 1222 and second connection pads 1224 may have a first pitch, P1. In the exemplary illustration of FIG. 12, the first connection pads 1222 and second connection pads 1224 are not drawn to scale.

Turning now to the flexible circuit board 1220, where FIG. 12 depicts the flexible circuit board 1220 after coupling (e.g., operationally electrically coupling, bonding) of the first connection pads 1222 of the substrate 1202 to the second connection pads 1224 of the flexible circuit board 1220. In the exemplary illustration of FIG. 12, the flexible circuit board 1220 may include a body 1207 and an arm 1204, where the arm may have two portions, a first portion 1210 and a second portion 1205.

The first portion 1210 may include the plurality of second connection pads 1224 configured to be coupled to corresponding ones of the plurality of first connection pads 1222 of the substrate 1202. The shape of the first portion 1210 may correspond to the shape of a segment of the annular border area 1208. In some implementations, the shape of the segment of the annular border area 1208 may correspond to a semicircular segment of a ring. In some implementations, an outer diameter of the first portion may be less than or equal to the outer diameter 1213 of the substrate 1202. In some implementations, the width of the first portion 1210 in a radial direction may correspond to a width of the annular border area 1208 in the radial direction. In some implementations, the width of the first portion 1210 in a radial direction may correspond to a width of the annular border area 1208 in the radial direction by being less than or equal to the width of the annular border area 1208 in the radial direction. In some aspects, an edge of the first portion 1210, which is proximal to an edge of the display area 1206, can extend to the edge of the display area 1206. A gap may be left between the edge of the display area 1206 and the edge of the first portion 1210, as shown in FIG. 12, for example, to account for manufacturing tolerances.

In an aspect, an edge of the first portion 1210, which is proximal to an edge of the display area 1206, may extend into (e.g., encroach) the frit border 1209. In an implementation, extending the edge of the first portion 1210 of the arm 1204 toward the edge of the display area 1206, and for example into the frit border 1209, may increase the space available to route a plurality of transmission lines 1226 as they extend between the second connection pads 1224 and the second portion 1205 of the arm 1204.

In the exemplary illustration of FIG. 12, a small percentage of a total number of the plurality of transmission lines 1226 is shown to avoid cluttering the illustration. In the exemplary illustration of FIG. 12, the plurality of transmission lines 1226 are not drawn to scale. In an implementation, the center-to-center pitch of the plurality of transmission lines 1226 in the second portion 1205 of the arm 1204 may be referred to as a second pitch, P2.

In aspects described herein, P1 may be greater than P2. In other words, the pad-to-pad spacing of the second connection pads 1224 in the first portion 1210 of the arm 1204 may be greater than (e.g., wider than) the line-to-line spacing between the corresponding plurality of transmission lines 1226 in the second portion 1205 of the arm.

Accordingly, a first area of the substrate 1202, corresponding to the first portion 1210 of the arm 1204 of the flexible circuit board 1220, can be configured to accommodate the first connection pads 1222 of the substrate 1202. The first connection pads 1222 of the substrate 1202 may be coupled (e.g., bonded) to the second connection pads 1224 of the flexible circuit board 1220. In one implementation, the first area of the substrate 1202 may be a segment of the annular border area 1208. In one implementation, the segment of the annular border area 1208 may be an undivided (e.g., a continuous, an unbroken) segment.

The second portion 1205 of the arm 1204 can be configured to accommodate the plurality of transmission lines 1226 (e.g., control lines, display driver lines, power lines, and/or ground lines) that extend (e.g., emanate) from the second connection pads 1224. The plurality of transmission lines 1226 may couple the display driver 1212 to the plurality of second connection pads 1224. The plurality of transmission lines 1226 may be routed on and/or in the first portion 1210 of the arm 1204 to the second portion 1205 of the arm 1204 and may occupy an area on and/or within the second portion 1205 of the arm 1204. In an aspect, an arc length 1211 of the first portion 1210 of the arm 1204 may be greater than an arc length 1203 of the second portion 1205 of the arm 1204. As used herein, an arc length may be a length of an arc having endpoints at opposite ends of a portion (e.g., first portion 1210, second portion 1205) of the arm 1204 as measured, for example, at the circumference of the substrate 1202. In an aspect, an arc length 1211 of the first portion 1210 of the arm 1204 may be greater than a width of the second portion 1205 of the arm 1204. In some implementations, the second portion 1205 may have a width ranging from approximately 1 mm to approximately 12 mm; in some implementations, the second portion 1205 may have a width of approximately 5 mm.

The second portion 1205 of the arm 1204 can be configured to wrap around the substrate 1202. The second portion 1205 of the arm 1204 can wrap around the substrate 1202, for example, along a fold line parallel to an edge of the substrate 1202. In an aspect where an outer perimeter of the substrate 1202 includes a curvilinear segment adjoined to a facet 1215, the fold line may be adjacent to the facet 1215 of the substrate 1202. The second portion 1205 may have a minimum bend radius. The minimum bend radius may depend on factors, including, the thickness of the material used to fabricate the second portion 1205 (e.g., the material used to fabricate the flexible circuit board 1220), the thickness and types of conductive material (e.g., metal) used to fabricate transmission lines in the second portion 1205, etc.

In some implementations, the minimum bend radius may range from approximately 0.1 mm to approximately 0.6 mm. In some implementations, the minimum bend radius may be approximately 0.3 mm to approximately 0.4 mm.

In an aspect, the plurality of transmission lines 1226 can be accommodated in the second portion 1205 of the arm 1204, which may be relatively narrower than the first portion 1210 of the arm 1204 by, for example, implementing transmission lines with a center-to-center pitch (e.g., P2) that is less than the center-to-center pitch (e.g., P1) of the corresponding second connection pads 1224 in the first portion 1210 of the arm 1204. In an aspect, the plurality of transmission lines 1226 can be accommodated in the, relatively narrower, second portion 1205 of the arm 1204 by, for example, implementing a flexible circuit board 1220 having multiple layers to increase a density of the plurality of transmission lines 1226 on and/or within the second portion 1205 of the arm 1204. In an aspect, the plurality of transmission lines 1226 can be accommodated in the relatively narrower second portion 1205 of the arm 1204 by, for example, implementing transmission lines with a center-to-center pitch (e.g., P2) that is less than the center-to-center pitch (e.g., P1) of the corresponding second connection pads 1224 in the first portion 1210 of the arm 1204 and implementing a flexible circuit board 1220 having multiple layers to increase a density of the plurality of transmission lines 1226 on and/or within the second portion 1205 of the arm 1204.

According to one implementation, the substrate 1202 may include a round outer perimeter and may present a round edge in an area adjacent to the second portion 1205 of the arm 1204 of the flexible circuit board 1220. According to another implementation, the substrate 1202 may include an outer perimeter, where the outer perimeter includes a curvilinear segment adjoined to a facet 1215 (e.g., a flat segment), and the facet 1215 may be adjacent to the second portion 1205 of the arm 1204 of the flexible circuit board 1220. The second portion 1205 may be configured to wrap around an edge of the substrate 1202 adjacent to the facet 1215.

Exemplary Electronic Device

FIG. 13A illustrates a topside plan view of one implementation of an electronic device 1300 (e.g., a device) that may include any of the substrates of FIGS. 3-12 described herein. FIG. 13B illustrates a cross-section view taken along the line 13B-13B in FIG. 13A. The electronic device 1300 may be a wearable device. In an aspect, the electronic device 1300 may be a wristwatch-like wearable device, which may be referred to as a smartwatch.

The electronic device 1300 includes a housing 1305. The housing 1305 may have a recess 1304 with an inner wall 1340 and an outer wall 1342. The electronic device 1300 may include a bezel 1328. The housing 1305 may have an opening 1338, in the topside of the housing 1305 or in the bezel 1328, through which a user may view a display area 1306 of a substrate 1302 disposed within the housing 1305. The substrate 1302 may be included as a component of a display panel. The display panel may include, for example, the substrate 1302 and a cover glass or film 1330.

In some implementations, the housing 1305 may be round (e.g., a circular housing). In some implementations, the inner wall 1340 may be round (e.g., a circular inner wall) and the outer wall 1342 may be round (e.g., a circular outer wall). In some implementations, the inner wall 1340 and/or the outer wall 1342 of the housing 1305 may include round and non-round segments. The substrate 1302 may be disposed within the recess 1304.

A display area 1306 may be fabricated on the substrate 1302. In the exemplary aspect of FIG. 13, the display area 1306 may be round. The display area 1306 may be centered within the substrate 1302. The display area 1306 may include rows and columns of pixels (e.g., light emitting active pixel circuits) distributed across the display area (depicted as a cross-hatch pattern). That is, the pixels may be configured to be an active display area. A border area 1308 of the substrate 1302 may be concealed below an edge of the housing 1305 or the bezel 1328. Signals on transmission lines (e.g., control lines, display driver lines, power lines, and/or ground lines) coupled to the pixels in the display area 1306 and peripheral circuits in the border area 1308 may be coupled between connection pads in the border area 1308 to a display driver (e.g., a chip, an ASIC). In one aspect, the signals may be coupled via a multiple-arm flexible circuit board (e.g., a flexible substrate circuit board, flexible ribbon circuit board, flexible film circuit board), from the front-side (e.g., topside) of the substrate to the display driver adjacent to the backside of the substrate. In another aspect, the signals may be coupled via a single-arm flexible circuit board, where the center to center pitch of connection pads in the border area 1308 of the substrate 1302 is greater than the center-to-center pitch of the transmission lines in a portion of the single-arm flexible circuit board that wraps around the substrate 1302, between the front-side (e.g., topside) and the backside of the substrate. The display driver may be mounted to the flexible circuit board adjacent to the backside of the substrate 1302. All of the display area 1306 may be visible from a topside of the housing 1305. A watch crystal 1332 may fill the opening 1338 in the housing 1305, for example adjacent to the cover glass or film 1330.

A wrist strap 1334 may be coupled to the housing 1305. The wrist strap 1334 may be coupled to the housing 1305, for example, by wrist strap attachment points 1336. The wrist strap 1334 and wrist strap attachment points 1336 may take on any shape as appreciated by persons of skill in the art.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

In addition, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to persons skilled in the art.

What is claimed is:

1. A device, comprising:
   a substrate, including:
      a perimeter having a plurality of segments having at least two different shapes including a curvilinear segment adjoined to a plurality of facet segments, each adjacent pair of the plurality of facet segments adjoined at an obtuse angle,
      a display area, including pixels on a surface of the substrate,
      a border area surrounding the display area, and
      a plurality of first connection pads, in the border area, coupled to the pixels, and divided into groups of first connection pads, each of the groups of first connection pads adjacent to a corresponding one of the plurality of facet segments; and
   a flexible circuit board having a plurality of arms corresponding to the plurality of facet segments, each of the plurality of arms coupled to a corresponding one of the groups of first connection pads.

2. The device of claim 1, wherein the curvilinear segment is semicircular.

3. The device of claim 1, wherein the display area is round.

4. The device of claim 1, wherein the border area is annular.

5. The device of claim 1, wherein the border area has a width and, for a given diameter substrate and a given quantity of first connection pads, the width of the border area is reduced by adding facet segments to the plurality of facet segments to reduce a number of first connection pads in each of the groups of first connection pads.

6. The device of claim 1, further comprising a display driver operationally coupled to the flexible circuit board, wherein the groups of first connection pads adjacent to the plurality of facet segments are coupled to the display driver via the plurality of arms of the flexible circuit board.

7. The device of claim 6, wherein the flexible circuit board includes only one display driver.

8. The device of claim 1, wherein each arm of the plurality of arms includes only one fold that is parallel to an edge of a corresponding facet segment, to facilitate wrapping each arm around the perimeter of the substrate and positioning the flexible circuit board adjacent to a backside of the substrate before a plurality of second connection pads of each arm are coupled to corresponding first connection pads of the substrate.

9. The device of claim 1, wherein an arm of the plurality of arms includes one fold that is parallel to an edge of a corresponding facet segment and a plurality of non-parallel folds, to facilitate wrapping the arm around the perimeter of the substrate and positioning the flexible circuit board adjacent to a backside of the substrate after a plurality of second connection pads of each arm of the plurality of arms are coupled to corresponding first connection pads on the substrate.

10. The device of claim 1, wherein the device is incorporated into an electronic device selected from a group including at least one of a wearable device and a wristwatch-like wearable device.

11. A device, comprising:
   a substrate, including:
      a perimeter having a plurality of segments having at least two different shapes including a curvilinear segment adjoined to a plurality of facet segments, each adjacent pair of the plurality of facet segments adjoined at an obtuse angle,
      a display area, including pixels on a surface of the substrate,
      a border area surrounding the display area, and
      a plurality of first connection pads, in the border area, coupled to the pixels, and divided into groups of first connection pads, each of the groups of first connection pads adjacent to a corresponding one of the plurality of facet segments; and
   means comprised of one circuit board for coupling to the plurality of first connection pads.

12. The device of claim 11, wherein the display area is round.

13. The device of claim 11, wherein the border area is annular.

14. The device of claim 11, wherein the means comprised of one circuit board for coupling to the plurality of first connection pads comprises a flexible circuit board having a plurality of arms corresponding to the plurality of facet segments, each of the plurality of arms coupled to a corresponding one of the groups of first connection pads.

15. The device of claim 14, wherein each arm of the plurality of arms includes only one fold that is parallel to an edge of a corresponding facet segment, to facilitate wrapping each arm around the perimeter of the substrate and positioning the flexible circuit board adjacent to a backside of the substrate before a plurality of second connection pads of each arm are coupled to corresponding first connection pads of the substrate.

16. The device of claim 14, wherein an arm of the plurality of arms includes one fold that is parallel to an edge of a corresponding facet segment and a plurality of non-parallel folds, to facilitate wrapping the arm around the perimeter of the substrate and positioning the flexible circuit board adjacent to a backside of the substrate after a plurality of second connection pads of each arm of the plurality of arms are coupled to corresponding first connection pads on the substrate.

17. A device, comprising:
   a substrate, including:
      a first surface, an opposite second surface, and an edge at a perimeter of the substrate, wherein the perimeter includes a plurality of segments having at least two different shapes including a curvilinear segment adjoined to N facet segments, adjacent pairs of the N facet segments adjoined at an obtuse angle, wherein N is greater than or equal to two,
      a plurality of pixels within a display area of the substrate,
      N groups of connection pads, coupled to the plurality of pixels, within a border area peripheral to the display area, each of the N groups of connection pads adjacent to a corresponding one of the N facet segments; and
   a flexible circuit board configured with N arms, wherein each of the N arms is coupled to a corresponding one of the N groups of connection pads.

18. The device of claim 17, wherein the curvilinear segment is semicircular.

19. The device of claim 17, wherein the display area is round.

20. The device of claim 17, wherein the border area is annular.

21. The device of claim 17, wherein the border area has a width and, for a first diameter substrate, the width of the border area is reduced by increasing a value of N.

22. The device of claim 17, further comprising a display driver, wherein each of the N groups of connection pads is coupled to the display driver via the N arms of the flexible circuit board.

23. The device of claim 17, wherein each of the N arms includes only one fold, parallel to a corresponding facet segment, to facilitate wrapping the N arms around the edge of the substrate and positioning the flexible circuit board adjacent to a backside of the substrate, before the N arms are coupled to the N groups of connection pads.

24. The device of claim 17, wherein each of the N arms includes one fold parallel to a corresponding facet segment and a plurality of non-parallel folds, to facilitate wrapping the N arms around the edge of the substrate and positioning the flexible circuit board adjacent to a backside of the substrate after the N arms are coupled to the N groups of connection pads.

25. A device, comprising:
a substrate having an outer perimeter including a curvilinear segment adjoined to a facet segment;
a plurality of pixels on a first side of the substrate, within a display area;
a plurality of first connection pads on the first side of the substrate, within an annular border area peripheral to the display area and adjacent to the outer perimeter, the plurality of pixels coupled to the plurality of first connection pads, wherein the plurality of first connection pads are arranged in a segment of the annular border area that includes the facet segment and a portion of the curvilinear segment and an arclength of the segment of the annular border area is less than a circumference of the outer perimeter; and
a flexible circuit board including:
a first portion including a plurality of second connection pads configured to be coupled to corresponding ones of the plurality of first connection pads, the first portion having a shape that corresponds to the segment of the annular border area that includes the facet segment and the portion of the curvilinear segment, and
a second portion configured to wrap around an edge of the substrate adjacent to the facet segment and accommodate a plurality of transmission lines extending from the second connection pads, wherein the plurality of transmission lines are routed on and/or in the first portion to the second portion, occupy an area on and/or within the second portion, and an arc length of the first portion as measured at the outer perimeter is greater than an arc length of the second portion as measured at the outer perimeter,
wherein a center-to-center pitch of the plurality of second connection pads of the first portion is greater than a center-to-center pitch of the plurality of transmission lines occupying the area on and/or within the second portion.

26. The device of claim 25, wherein the outer perimeter is round.

27. The device of claim 25, wherein the display area is round.

28. The device of claim 25, wherein an edge of the first portion, which is proximal to an edge of the display area, extends to the edge of the display area.

29. The device of claim 25, wherein an edge of the first portion, which is proximal to an edge of the display area, extends into a frit border of the substrate.

* * * * *